(12) United States Patent
Wolfowicz et al.

(10) Patent No.: US 12,174,225 B2
(45) Date of Patent: Dec. 24, 2024

(54) ELECTROMETRY BY OPTICAL CHARGE CONVERSION OF DEFECTS IN THE SOLID-STATE

(71) Applicant: The University of Chicago, Chicago, IL (US)

(72) Inventors: Gary Wolfowicz, Paris (FR); Samuel James Whiteley, Los Gatos, CA (US); David Daniel Awschalom, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 18/158,895

(22) Filed: Jan. 24, 2023

(65) Prior Publication Data

US 2023/0349957 A1 Nov. 2, 2023

Related U.S. Application Data

(63) Continuation of application No. 16/968,471, filed as application No. PCT/US2019/017817 on Feb. 13, 2019, now Pat. No. 11,619,660.

(Continued)

(51) Int. Cl.
G01R 15/24 (2006.01)

(52) U.S. Cl.
CPC .................. G01R 15/24 (2013.01)

(58) Field of Classification Search
CPC ........... B82Y 15/00; G01N 2021/6495; G01N 21/6489; G01N 33/5308; G01N 33/54306;

(Continued)

(56) References Cited

U.S. PATENT DOCUMENTS

| 4,063,158 A | 12/1977 | Sabisky et al. |
| 4,417,140 A | 11/1983 | Adolfsson et al. |

(Continued)

OTHER PUBLICATIONS

Casas, C. F. de las et al.; "Stark Tuning and Electrical Charge State Control of Single Divacancies in Silicon Carbide"; Applied Physics Letters, 111(26); arXiv: 1710.10705; Dec. 25, 2017; 12 pages.

(Continued)

*Primary Examiner* — Vinh P Nguyen
(74) *Attorney, Agent, or Firm* — Crowell & Moring LLP

(57) ABSTRACT

Methods and systems are disclosed for sensing an environment electric field. In one exemplary implementation, a method includes disposing a sensor in the environment, wherein the sensor comprising a crystalline lattice and at least one optically-active defect in the crystalline lattice; pre-exciting the crystalline lattice to prepare at least one defect in a first charge state using a first optical beam at a first optical wavelength; converting at least one defect from the first charge state to a second charge state using a second optical beam at a second optical wavelength; monitoring a characteristics of photoluminescence emitted from the defect during or after the conversion of the at least one defect from the first charge state to the second charge state; and determining a characteristics of the electric field in the environment according to the monitored characteristics of the photoluminescence.

20 Claims, 19 Drawing Sheets

100

Related U.S. Application Data

(60) Provisional application No. 62/630,503, filed on Feb. 14, 2018.

(58) Field of Classification Search
CPC ....... G01N 33/54386; G01N 33/54373; G01R 15/24; G01R 31/2607; G01R 29/0885; G01R 33/323; G02B 27/286; G02B 6/1225; G02F 1/0344; G02F 1/39; G02F 2202/32; G02F 1/0126; H01S 5/06216; H01S 5/3402; H01S 3/107; H01S 3/1127; H01S 5/0658; H01S 5/0657
See application file for complete search history.

(56) References Cited

U.S. PATENT DOCUMENTS

| | | | | |
|---|---|---|---|---|
| 4,514,860 A * | 4/1985 | Adolfsson | ............... | G08C 23/06 324/76.36 |
| 5,574,588 A * | 11/1996 | Kawanishi | ............... | H04B 10/60 398/154 |
| 5,726,789 A * | 3/1998 | Horiuchi | ............... | G02F 1/0327 398/191 |
| 6,304,583 B1 | 10/2001 | Ohmer et al. | | |
| 7,715,725 B2 * | 5/2010 | Takasaka | ............... | H04L 7/0075 398/154 |
| 10,209,190 B2 | 2/2019 | Kiss | | |
| 10,338,156 B2 * | 7/2019 | Wu | ..................... | G01R 33/032 |
| 10,481,155 B2 | 11/2019 | Cleveland | | |
| 2004/0041083 A1 | 3/2004 | Kadogawa et al. | | |

OTHER PUBLICATIONS

International Search Report mailed Oct. 15, 2019 for International Application No. PCT/US2019/017817.
Written Opinion mailed Oct. 15, 2019 for International Application No. PCT/US2019/017817.
Aslam, N. et al.; "Photo-induced ionization dynamics of the nitrogen vacancy defect in diamond investigated by single-shot charge state detection"; New Journal of Physics, vol. 15, 13064; Jan. 31, 2013; 18 pages.
Baranov, P. G. et al.; "Silicon vavancy in SiC as a promising quantum system for single-defect and single-photon spectroscopy"; Physical Review, B 83, 125203; Mar. 15, 2011; 12 pages.
Bradbury, F. R. et al.; "Stark Tuning of Donor Electron Spins in Silicon"; Physical Review Letters, 97, 176404; Oct. 27, 2006; 4 pages.
Bylander, J. et al.; "Current measurement by real-time conunting of single electrons"; Nature 434; Mar. 17, 2005; pp. 361-364.
Chaikovskii, I. A.; "AC Conductivity of Highly Inhomogeneous Semiconductors"; Physica status solidi 129; Jan. 1, 1985; pp 393-398.
Chen, E. H. et al.; "High-sensitivity spin-based electrometry with an ensemble of nitro-vacancy centers in diamond"; Physical Review A, 95; 53417; May 2017; 7 pages.
Chen, R.; "Apparent stretched-exponential luminescence decay in crystalline solids"; Journal of Luminescence, 102-103; May 1, 2003; pp. 510-518.
Dolde, F. et al.; "Electric-field sensing using single diamond spins"; Nature Physics, 7; Jun. 2011; pp. 459-463.
Falk, A. L. et al.; "Electrically and Mehcnaically Tunable Electron Spins in Silicon Carbide Color Centers"; Physical Review Letters, 112; 187601, May 9, 2014; 6 pages.
Golter, D. A. et al.; "Optical switching of defect charge states in 4H-SiC"; Scientific Reports, 7.; 13406 Oct. 17, 2017; 5 pages.
Koehl, W. F.; "Room temperature coherent control of defect spin qubits in silicon carbide"; Nature, 479, Nov. 3, 2011; pp. 84-87.
Kraus, H. et al.; "Magnetic field and temperature sensing with atomic-scale spin defects in silicon carbide"; Scientific Reports, 4; 5303; Jul. 4, 2014; 8 pages.
Iwasaki, T. et al.; "Direct Nanoscale Sensing of the Internal Electric Field in Operating Semiconductor Devices Using Single Electron Spins"; ACS Nano, 11; Feb. 28, 2017; pp. 1238-1245.
Nonnenmacher, M. et al.; "Kelvin probe force microscopy"; Applied Physics Letters, 58; Jun. 24, 1991; pp. 2921-2923.
Plakhotnik, T. et al.; "All-Optical Thermometry and Thermal Properties of the Optically Detected Spin Resonances of the NV—Center in Nanodiamond"; Nano Letters, 14; Aug. 7, 2014; pp. 4989-4996.
Rodin, L. et al.; "Magnetometr with nitrogen-vacancy defects in diamond"; Reports on Progress in Physics, 77; 56503; May 6, 2014; 27 pages.
Rothberg, S. J. et al.; "An international review of laser Doppler vibrometry: Making light work of vibration measurement"; Optics and Lasers in Engineering, 99; 11-22; Dec. 1, 2017; 34 pages.
Schoelkopft, R. J. et al.; "The Radio-Frequency Single-Electron Transistor (RF-Set): A Fast and Ultrasensitive Electrometer"; Science, 280; May 22, 1998; pp. 1238-1242.
Taylor, J. M. et al.; "High-sensitivity diamond magnetometer with nanoscale resolution"; Nature Physics, 4; 810-816 Sep. 14, 2008; 8 pages.
Toyli, D. M. et al.; "Fluorescence thermometry enhanced by the quantum coherence of single spins in diamond"; Proceedings of the National Academy of Sciences, 110; May 21, 2013; pp. 8417-8421.
Trusheim, M. E. et al.; "Wide-field strain imaging with preferentially aligned nitrogen-vacancy centers in polycrystalline diamond"; New Journal of Physics, 18; 123023; Dec. 19, 2016; 8 pages.
Van de Walle, C. G.; "Stretched-exponential relaxation modeled without invoking statistical distributions"; Physical Review B, 53; May 1, 1996; pp. 11292-11295.
Wolfowicz, G. et al.; "Conditional Control of Donor Nuclear Spins in Silicon Using Stark Shifts"; Physical Review Letters, 113; 157601; Oct. 10, 2014; 5 pages.
Wolfowicz, G. et al.; "Optical charge state control of spin defects in 4H-SiC"; Nature Communications; arXiv: 1705.09714; Nov. 30, 2017; 9 pages.

* cited by examiner

700

```
┌─────────────────────────────────────┐
│ Dispose a sensor in an environment  │  702
│ having an electric field            │
└─────────────────────────────────────┘
                 ↓
┌─────────────────────────────────────┐
│ Optically prepare the sensor into   │  704
│ an optically bright (or dark) charge│
│ state                               │
└─────────────────────────────────────┘
                 ↓
┌─────────────────────────────────────┐
│ Optically induce charge conversion  │
│ from the optically bright (or dark) │  706
│ charge state to a optically dark    │
│ (or bright) charge state of the     │
│ sensor                              │
└─────────────────────────────────────┘
                 ↓
┌─────────────────────────────────────┐
│ Optically monitor a probability     │
│ that the sensor remains in the      │
│ optically bright (or dark) charge   │  708
│ state by measuring characteristics  │
│ of photoluminescence induced from   │
│ the charge conversion               │
└─────────────────────────────────────┘
                 ↓
┌─────────────────────────────────────┐
│ Obtain a difference between the     │
│ measured characteristics of the     │
│ photoluminescence and a reference   │
│ characteristics of a reference      │  710
│ photoluminescence pre-measured by   │
│ the sensor without the presence of  │
│ the environmental electric field    │
└─────────────────────────────────────┘
                 ↓
┌─────────────────────────────────────┐
│ Determining a characteristics of    │
│ the environmental electric field    │  712
│ according to the difference         │
└─────────────────────────────────────┘
```

FIG. 7

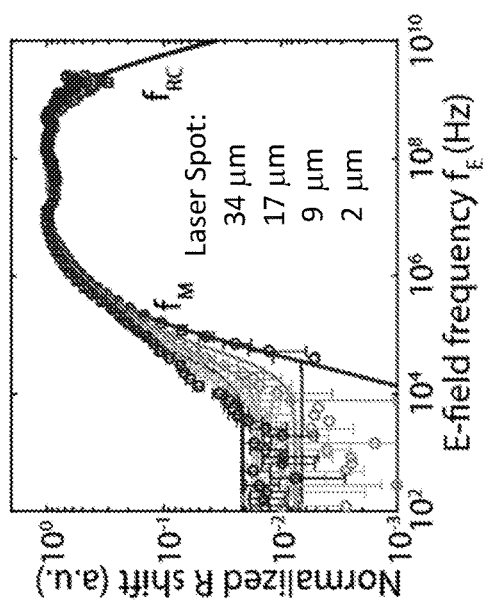
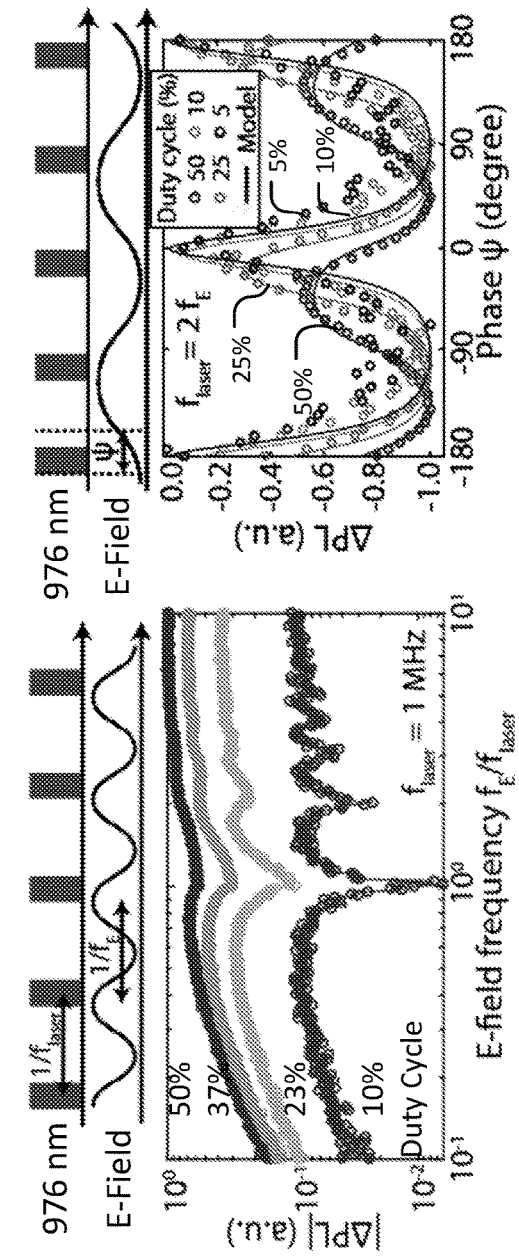
FIG. 14A
FIG. 14B
FIG. 14C

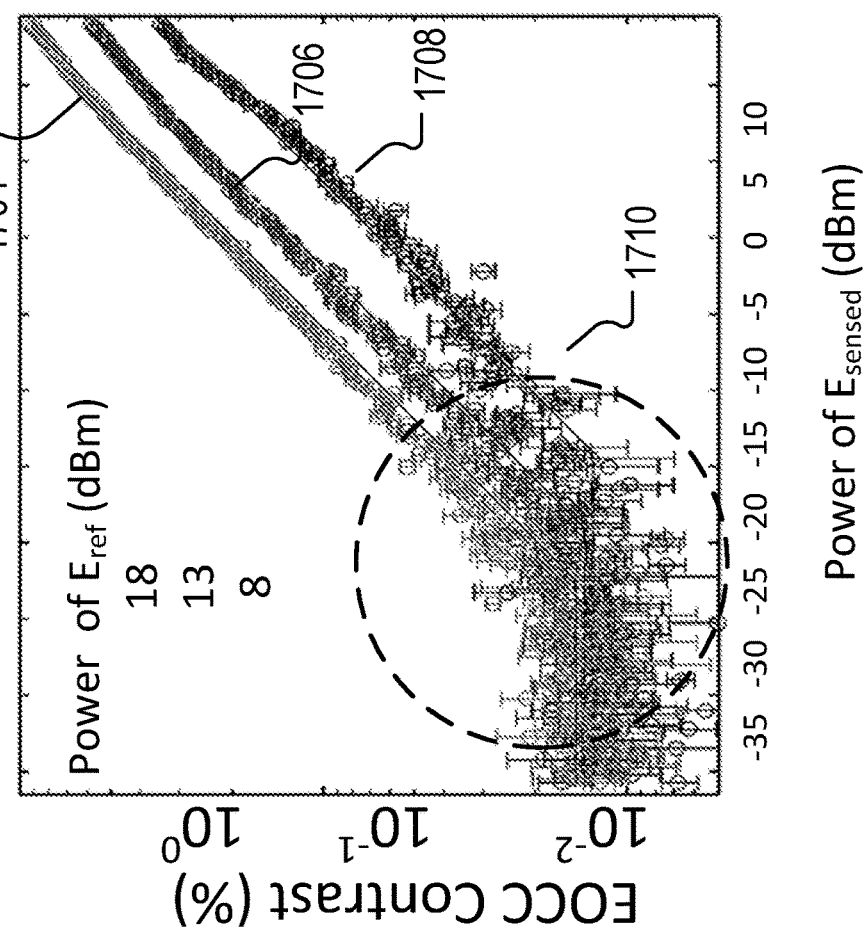
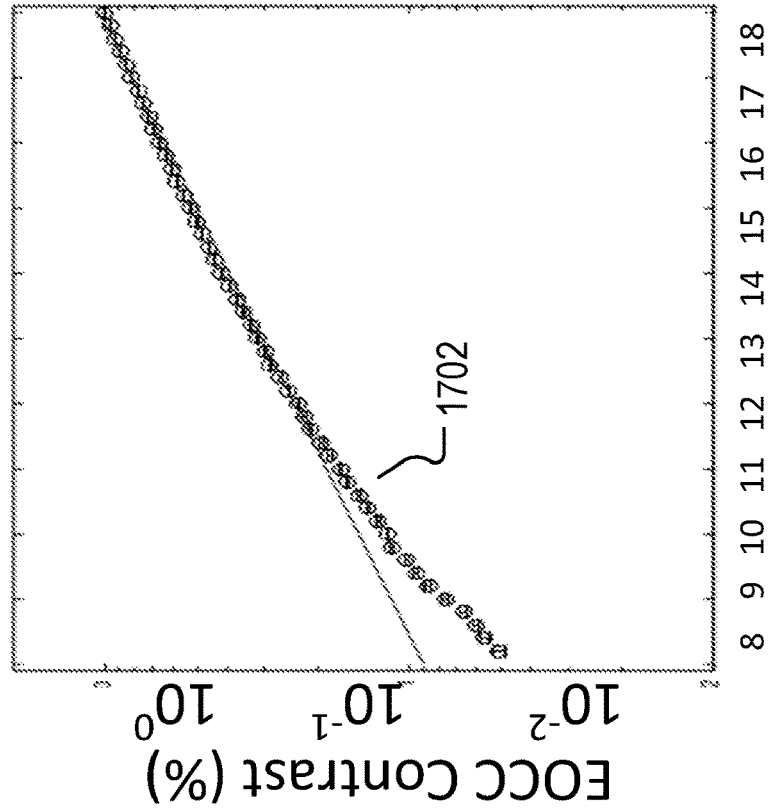
FIG. 17B
FIG. 17A

ELECTROMETRY BY OPTICAL CHARGE CONVERSION OF DEFECTS IN THE SOLID-STATE

CROSS-REFERENCE

This application is a continuation application of U.S. Non-Provisional patent application Ser. No. 16/968,471, filed on Aug. 7, 2020, now U.S. Pat. No. 11,619,660, which claims priority to the U.S. Provisional Patent Application No. 62/630,503, filed on Feb. 14, 2018, both entitled "Electrometry by Optical Charge Conversion of Defects in the Solid-State", which are incorporated herein by reference in their entireties.

GOVERNMENT LICENSE RIGHTS

This invention was made with government support under grant number W911NF-15-2-0058 awarded by the Army Research Laboratory, and grant number 1641099 awarded by the National Science Foundation. The government has certain rights in the invention.

BACKGROUND

Detection of electric charges and sensing of electric fields are critical to applications including but not limited to metrology, electrical potential mapping, and characterization of electronic, optoelectronic or electromechanical devices. Traditional electrometry may be based on, for example, direct sensing of electric forces, electro-optic Ken effects, or using electron spin systems prepared and excited by electromagnetic waves in the optical, radio-wave or microwave frequency regime.

BRIEF DESCRIPTION OF THE DRAWINGS

The system and method may be better understood with reference to the following drawings and description. Non-limiting and non-exhaustive embodiments are described with reference to the following drawings. The components in the drawings are not necessarily to scale, emphasis instead being placed upon illustrating the principles of the invention.

FIG. 4 illustrates another exemplary optical configuration for the electrometry system of FIG. 1.

FIG. 7 shows a logic flow for sensing an environmental electric field using the electrometry system of FIG. 1.

FIGS. 14A-14C show other measured characteristics of an electrometry sensor based on deep defects in a semiconductor.

FIGS. 17A-17B show a comparison of exemplary measurement results between electrometry sensing configuration of FIG. 1 and heterodyne electrometry sensing configuration of FIG. 9.

SUMMARY

Figure 1:
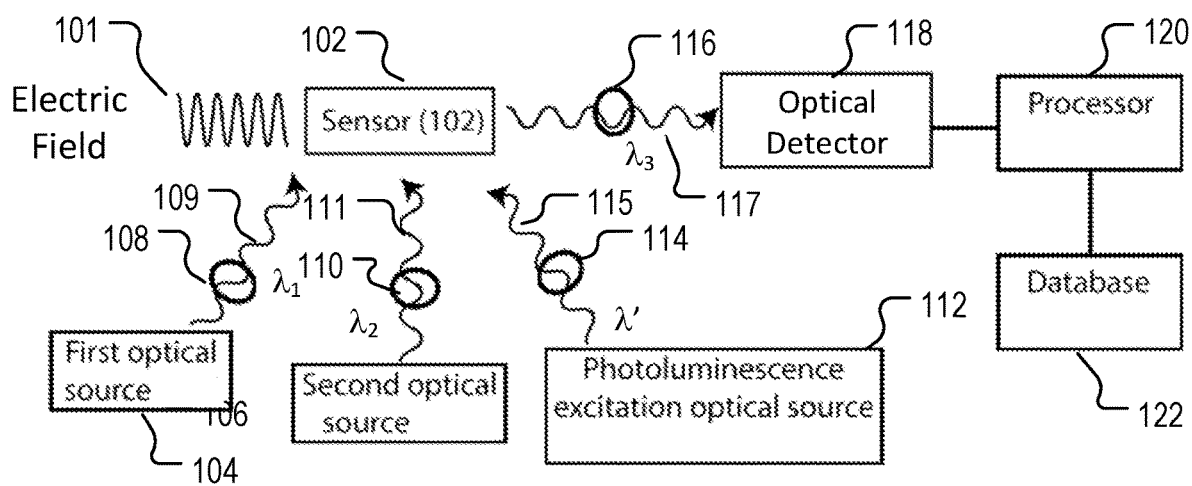
FIG. 1 illustrates an exemplary electrometry system for sensing and detecting an environmental electric field.

This disclosure is directed to systems and methods for sensing environment electric fields using optical excitation and monitoring. For example, an electrometry sensor is used in the disclosed systems and methods. The operation of the electrometry sensor is based on optical control of defect charge states in solid state host. The defect charge states may be optically monitored by detecting their photoluminescence. The optical control of the defect charge state may be affected by the presence of the environmental electric field. Such effect may be monitored by analyzing the photoluminescence detected from the defect charge states. As a result, characteristics of the environmental electric field may be determined.

In one implementation, a method for sensing an electric field in an environment is disclosed. The method includes pre-exciting a sensor comprising a crystalline lattice and at least one defect in the crystalline lattice to prepare the at least one defect in a first charge state using a first optical beam at a first optical wavelength; converting the at least one detect from the first charge state to a second charge state, using a second optical beam at a second optical wavelength, wherein photoluminescence associated with the first charge state being different from the second charge state; monitoring one or more characteristics of a photoluminescence emitted during or after the conversion of the at least one defect from the first charge state to the second charge state; and determining one or more characteristics of the electric field in the environment according to the one or more monitored characteristics of the photoluminescence.

In another implementation, a system for sensing electric field is disclosed. The system includes a sensor comprising a crystalline lattice having at least one defect; a first optical source emitting a first optical beam at a first optical wavelength; a second optical source emitting a second optical beam at a second optical wavelength; an optical detector for monitoring a photoluminescence from the sensor when the sensor is excited by the first optical beam and the second optical beam; a database; and a processor. The processor is configured to extract a first set of parameters from the photoluminescence; obtain a second set of predetermined parameters from a reference photoluminescence measured by the sensor and stored in the database; obtain a difference between the first set of parameters and the second set of predetermined parameters; and determine an environmental electric field of the sensor according to the difference.

In yet another implementation, another system for electrometry sensing is disclosed. The system includes a sensor comprising a crystalline lattice having at least one defect and a pair of electrodes for applying a reference electric field; a first optical source emitting a first optical beam at a first optical wavelength; a second optical source emitting a second optical beam at a second optical wavelength; an optical detector for generating a electric signal by collecting a photoluminescence from the sensor when the sensor is excited by the first optical beam and the second optical beam in presence of the environmental electric field and the reference electric field; and a circuitry. The circuitry is configured to filter the first signal to obtain a signal component at a beat frequency between the environmental electric field and the reference electric field; and extract the characteristics of the environmental electric field based on the signal component and characteristics of the reference electric field.

DETAILED DESCRIPTION

Embodiments of the invention and the various features and advantageous details thereof are explained more fully with reference to the non-limiting embodiments that are illustrated in the accompanying drawings and detailed in the following description. Descriptions of well-known starting materials, processing techniques, measurements techniques, components and equipment are omitted, so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

By way of introduction, the presence of electric charges or electric fields (herein referred generally as electric fields) in an environment may be determined and/or quantified. An electrometer may be used to measure such an electric field. Such an electrometer may include a sensor that determines the electric field by, e.g., electrically measuring a resulting electromagnetic force or measuring other parameters of the sensor as modified by the electric field, e.g., electron spin state parameters affected by the electric field via spin-electric coupling when the sensor includes electron spins. In some electrometers, the sensor may be configured by an external excitation or stimulation (herein referred generally as excitation) into a particular state before a measurement and determination of the environmental electric field can be performed. Such excitation may be introduced electromagnetically via, e.g., a local radio-wave or microwave frequency electromagnetic wave for exciting electron spin states in an electrometry sensor containing electron spins as the sensing elements.

In this disclosure, an electrometry sensor based on charge states of defects in solid-state materials, such as semiconductors, is disclosed. The sensor may be used to detect environmental electric field of a wide frequency range. The sensor may further be used to detect an environmental electric field exclusively using optical excitations and emitted photoluminescence. The optical excitation may be configured as either pulsed excitation or continuous-wave (CW) excitation. Exclusively using only optical excitation is advantageous because the optical beams may provide better penetration through substrates than radio-wave or microwave frequency electromagnetic waves (used, e.g., for electron spin excitation in electron spin based sensors), and thus may facilitate detecting local electric fields deep into a bulky sample. Further, all-optical excitation may avoid the requirement of including electrodes on the electrometry sensor for introducing external signals, e.g. radio-wave or microwave frequency electromagnetic wave excitation sources. Optical beams used for such excitation may be conveniently manipulated in free space and/or guided in optical fibers. The optical signals produced by such a sensor may be guided and detected remotely, offering improved adaptability of such an electrometry sensor.

The electrometry sensor based on charge states of defects in solid-state materials may be fabricated as an external/standalone/portable sensor that may be placed into an environment for sensing the presence and strength/frequency of electric fields. For example, the electrometry sensor may be placed in a scanning probe to measure fringe electric field from an electronic device. The electrometry sensor may be fabricated using diamond substrate for high-temperature tolerance and adapted to sense electric field in plasmas. It may be designed based on silicon carbide and other biocompatible materials and used in bio-sensing. The electrometry sensor may further be designed and used as internal and embedded electric field sensing and monitoring elements in active semiconductor devices. Its functioning in a semiconductor device may be monitored as indication of existence of defect states and be used in material quality control in development of electronic devices. It may be used for detecting electric field for characterization of high frequency devices, such as Micro-Electro-Mechanical Systems (e.g., microwave filter devices). For another example, such electrometry sensor may be adapted into acoustic wave devices (such as acoustic wave filters) for their characterization. For different applications, suitable host materials and defects may be chosen.

FIG. 1 illustrates an exemplary electrometry system 100 for detecting an environmental electric field 101 (herein also referred to as the electric field). The environmental electric field 101 may be, for example, an electromagnetic wave of a particular frequency. In the implementation of FIG. 1, the electrometry system 100 may include an electrometry sensor (herein also referred as sensor) 102 disposed or already present in an environment having the electric field 101, a first optical source 104, a second optical source 106, a photoluminescence (PL) excitation optical source 112, and a photodetector 118 for detecting a PL 117 emitted from the sensor 102. While the implementation in FIG. 1 is illustrated in the context of using the electrometry sensor 102 to measure external environmental electric filed, the sensor 102 may be a built-in part of a host material or device and the system illustrated in FIG. 1 may be used to measure internal electric field inside the host material and local to the built-in sensor. In addition, depending on the configuration and composition within the sensor 102 (type of defects and defect states), a single source or two sources among the first optical source 104, the second optical source 106, and the PL excitation optical source may be included (for achieving, charge conversion and PL excitation described below). For some other implementation of the sensor 102, more than three optical sources may be configured to achieve charge conversion and PL excitation.

The first optical source 104 and second optical source 106 may be arc lamps, light emitting diodes or laser sources and may operate in either a pulsed mode or a CW mode. The first optical source 104 and second optical source 106 may produce a first optical beam 109 and second optical beam 111. The optical beams 109 and 111 may further be processed by optics 108 and 110, respectively. Alternatively, optics 108 and 110 may be a single group rather than separate groups of optical elements. Optical beams 109 and 111 may propagate in free space, optical fibers, or a combination of free space and optical fibers. The optics 108 and 110 may include lenses, polarizers, and/or any other suitable free space or fiber optical elements.

The optical beams 109 and 111, after manipulation by the optics 108 and 110, respectively, may be directed to the sensor 102. The first optical beam 109 may be used to prepare the sensor into a first charge state. The second optical beam 111 may perform optical pumping that converts the sensor from the first charge state to a second charge state. In one implementation, the first charge state is optically bright and the second charge state is optically dark. In other words, when the sensor is in the first charge state, a photoluminescence (PL) may be induced whereas when the sensor is in the second charge state, a PL may not be induced. The preparation of the first charge state and the optical conversion to the second charge state may be achieved using any other optical configurations. The PL 117 may be induced for the first charge state by further excitation by the second optical beam 111. Alternatively, the PL for the first charge state may be induced using a separate PL excitation optical beam 115 from a PL excitation optical source 112. The PL excitation optical source, for example, may be a laser source. The PL excitation optical beam 115 may be further processed by optics 114 before being directed to excite the sensor 102 for inducing PL from the first charge state.

A charge conversion rate from the first charge state to the second charge state by the second optical beam 111 may be a function the environmental electric field 101. As such, the probability that the sensor remains in the optically bright first charge state may depend on the environmental electric field 101 during or after the charge conversion by the second optical beam 111. As a result, the characteristics of PL emission from the optically bright first charge state depend on the environmental electric field 101. These PL characteristics may include but are not limited to, for example, the intensity of the PL emission and the transient dynamics of the PL emission. Such dependence may be used for detection and quantification of the environmental electric field 101.

The first optical beam 109, the second optical beam 111, and the PL excitation optical beam 115 may be adjusted respective to particular optical wavelengths, $\lambda_1$, $\lambda_2$, and $\lambda'$, as illustrated in FIG. 1. In one implementation, the first optical beam 109 may be adjusted to a wavelength $\lambda_1$, shorter than the wavelength $\lambda_2$ of the second optical beam 111. The PL emission induced from the first charge state (bright state) may be at a particular wavelength $\lambda_3$. Wavelength $\lambda_3$ may be different from $\lambda_1$, $\lambda_2$, and $\lambda'$. In one implementation, $\lambda_3$ may be longer than $\lambda_2$ of the second optical beam 111. In one implementation, the first optical wavelength $\lambda_1$ may be in a wavelength range of 200 and 430 nanometers. In another implementation, the second optical wavelength $\lambda_2$ may be in a wavelength range of 700 and 1100 nanometers.

As shown in FIG. 1, the PL 117 emitting from the sensor may be collected/guided by optics 116 and detected by the PL detector 118. The PL detector 118, for example, may comprise a photo detector, such as a photodiode, a photomultiplier tube, or other optical detectors. The detected electric signal by the PL detector 118 as a result of the PL emission 117 may be digitized and communicated to a processor 120 for further processing. The processor 120 may be in communication with a database 122. The database may contain reference PL characteristics of reference PL from the sensor 102 pre-measured under presence of any environmental electrical field. The processor 120 may be responsible for determining and quantifying the environmental electric field 101 based on the measured PL characteristics from the sensor 102 under the influence of the environmental electric field 101 and the reference PL characteristics obtained from the database 122.

Figure 2:
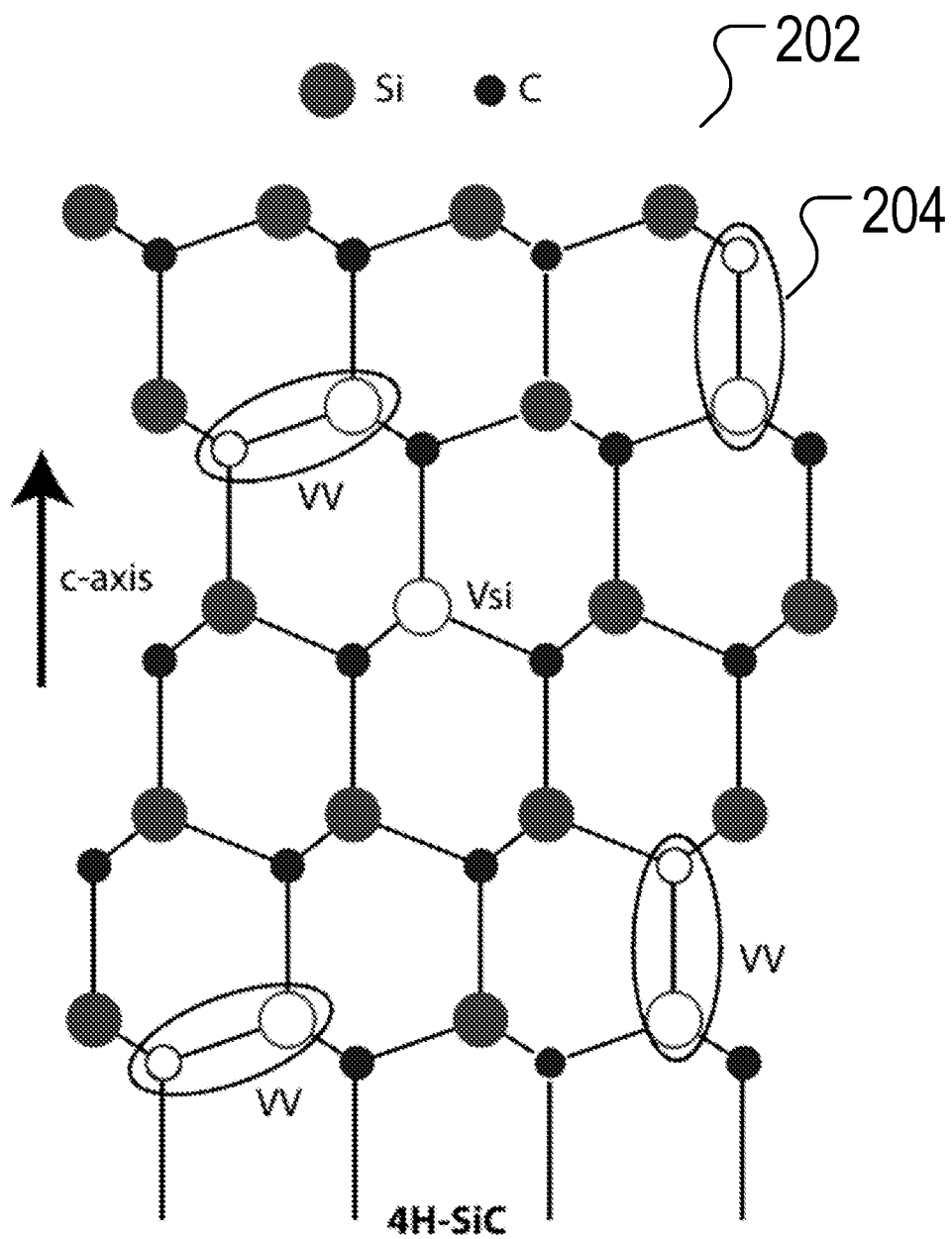
FIG. 2 illustrates an exemplary sensor based on deep defects in semiconductors.

FIG. 2 shows an exemplary semiconductor structure 200 that may be used as the electrometry sensor 102. In FIG. 2, the sensor 102 may include a 3C, 4H or 6H silicon carbide lattices (3C-SiC, 4H-SiC, or 6H-SiC) 202. The silicon carbide lattices 202 may further include one or more defects 204. The defects may be divacancies (VV) or silicon vacancies ($V_{Si}$). The vacancies may be produced by carbon implantation into the silicon carbide lattices 202 followed by thermal annealing. The carbon implantation, for example may be carried out in an exemplary implantation energy of 100 to 250 keV, resulting in a carbon dosage in a range of, for example, $10^{11}$ and $10^{13}$ ion cm$^{-2}$. The thermal annealing following the carbon implantation may be carried out at a temperature in a range of 600° C. and 1200° C. The thermal annealing may be performed for various durations. For example, the carbon implanted silicon carbide lattices may be annealed for 1 hour, 2 hours, 3 hours, 4 hours, and other durations. The vacancies illustrated in the silicon carbide lattices of FIG. 2 may provide the optically bright first charge state and the optically dark second charge state. The structure of FIG. 2 may further provide charge conversion rate that depends on the presence, magnitude, orientation and/or frequency of the environmental electric field. The term "defect" is used interchangeably with the term "impurity".

Other material system providing similar charge states and charge conversion characteristics may also be used as the electrometry sensor 102. These exemplary material systems include but are not limited to Lithium niobate (LiNbO3, having a bandgap~4 eV), quartz (having a bandgap>6 eV), aluminum nitride (AlN, having a bandgap of ~6 eV), gallium arsenide (GaAs, having a bandgap~1.4 eV), and diamond (having a bandgap~5 eV).

Figure 3:
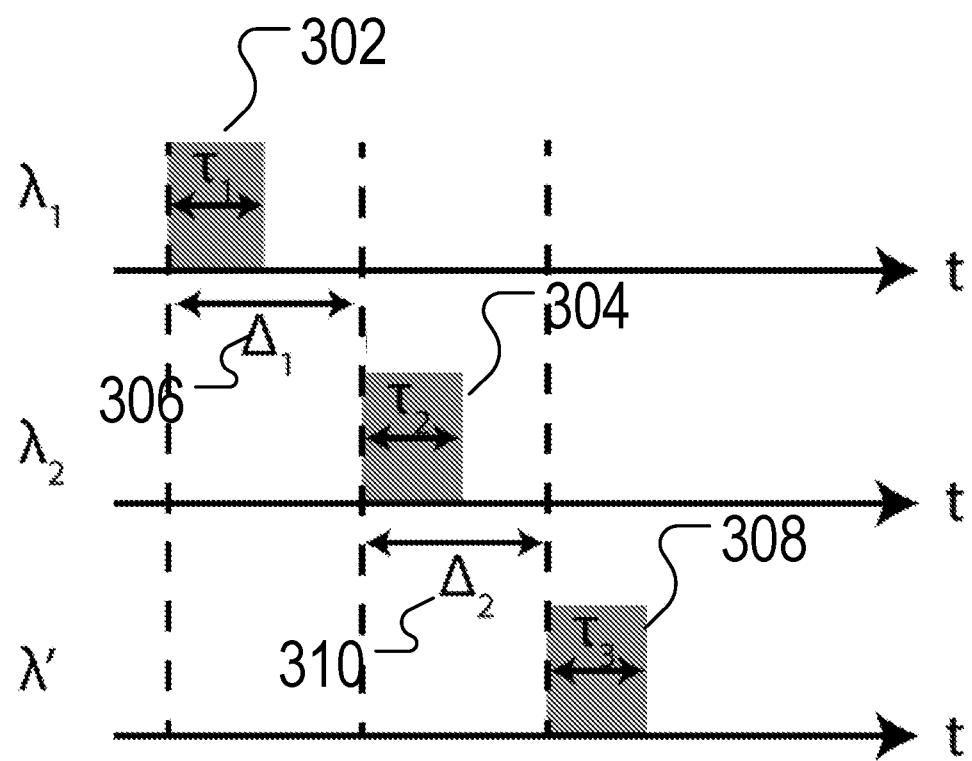
FIG. 3 illustrates an exemplary optical configuration for the electrometry system of FIG. 1.

FIG. 3 shows one exemplary timing configuration 300 of the first optical beam 109, the second optical beam 111, and the PL excitation optical beam 115. In the implementation of FIG. 3, the first optical beam 109 is configured in optical pulse 302 for preparing the sensor 102 into the optically bright first charge state. Following the optical pulse 302 in time with a small delay $\Delta_1$ 306, the second optical beam 111 is configured in optical pulse 304 for inducing a charge conversion between the optically bright first charge state to the optically dark second charge state of the sensor 102. The amount of charge conversion by the optical pulse 304 may depend on the environmental electric field 101. The delay $\Delta_1$ 306 may be made as small as possible as long as there is preferably insignificant time overlap between the optical pulse 302 and the optical pulse 304 such that the sensor is sufficiently prepared into the optically bright first charge state before the charge conversion by the pulse 304 is initiated. In one implementation, the optical pulse 304 may further induce PL emission from the sensor 102. In an alternative implementation, a separate PL excitation optical pulse 308 from the PL excitation optical source (112 of FIG. 1) with wavelength λ' may be used for inducing PL emission from the sensor 102. The PL excitation optical pulse 308 may overlap with the optical pulse 304 in time or may be slight delayed 310 by, e.g., $\lambda_2$.

Figure 4A:
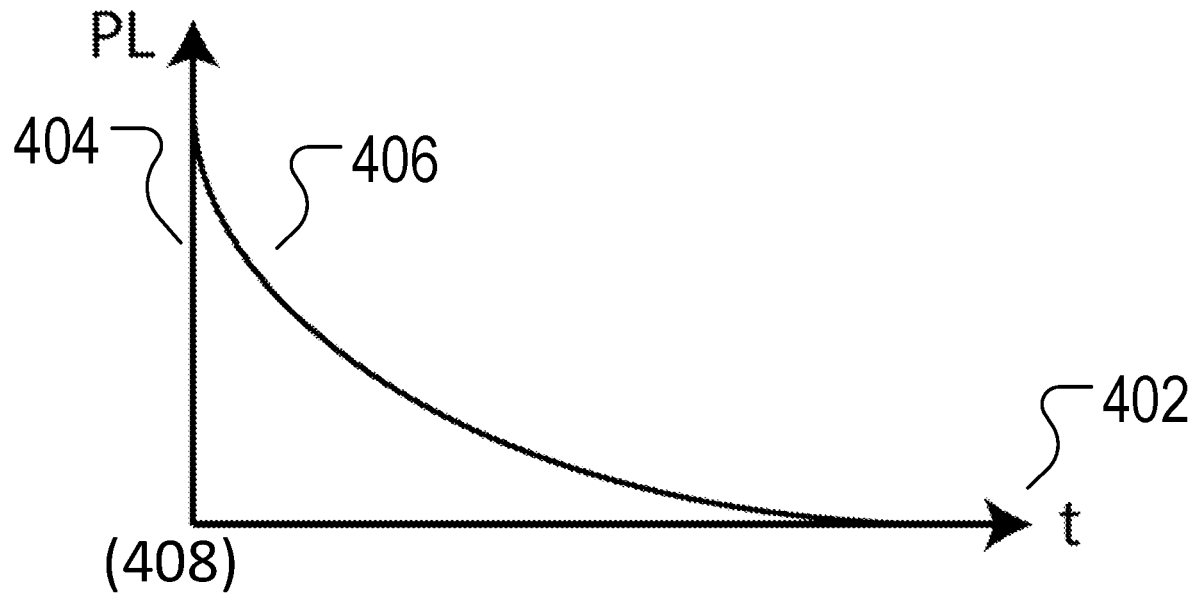
FIGS. 4A-4B illustrate transient photoluminescence measurements under the optical configuration of FIG. 3.
Figure 4B:
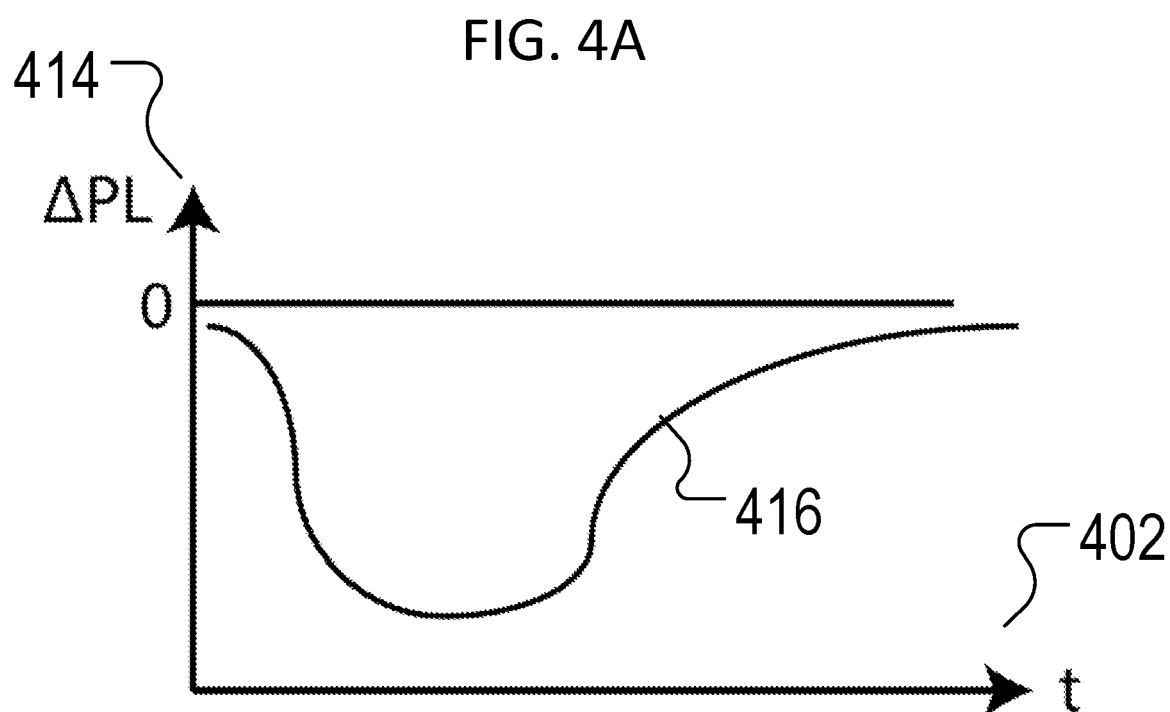
Figure 5:
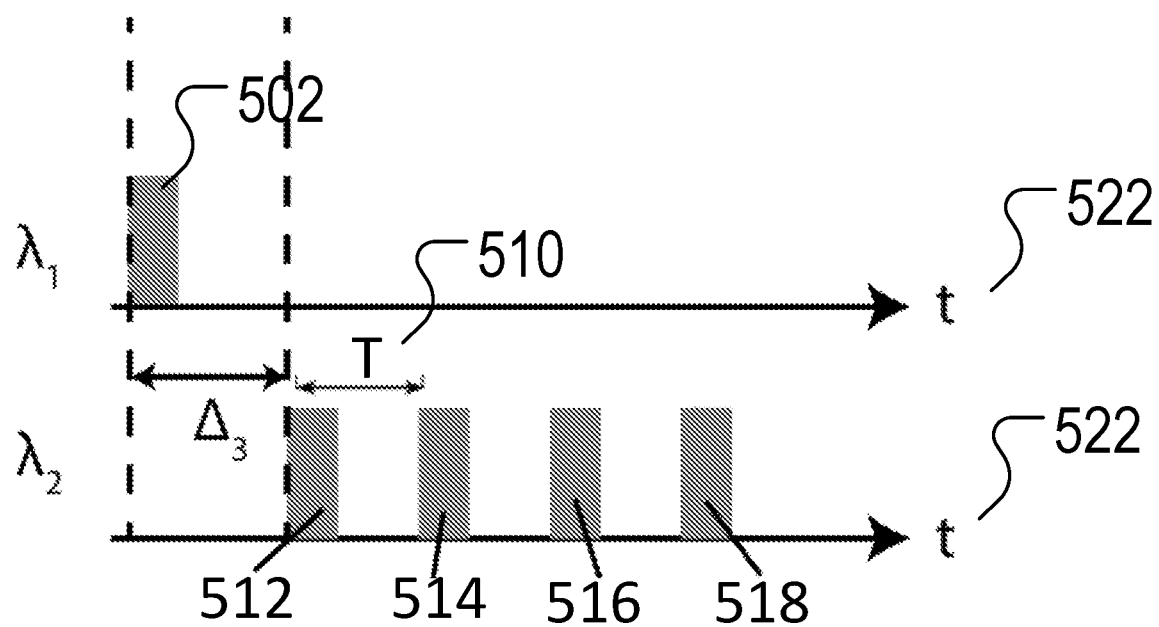

FIGS. 4A and 4b illustrate measurements and analysis that may be performed for detecting the environmental electric field 101 using the optical configuration of FIG. 3 in conjunction with the system configuration of FIG. 1. In particular, FIG. 4A illustrates a transient PL 404 from the sensor 102 following the pulse 304 (alternatively pulses 304 and 308) as a function of time 402 following the PL excitation pulse by either the second optical beam (304 of FIG. 3) or the PL excitation optical beam (308 of FIG. 3), when the environment electric field is present. The decay dynamics for the PL emission is shown by the curve 406. The curve may be fit by the processor 120 of FIG. 1 to, for example, a stretch exponential decay (see below) or other physical model. A first set of fitting parameters from this fitting may be recorded. Further, the difference between curve 406 and a corresponding reference curve measured by the sensor 102 without the presence of the environmental electric field may be obtained by the processor 120 of FIG. 1. Such corresponding reference curve may be pre-measured and recorded in the database 122 of FIG. 1. The difference curve 416 in transient PL 414 is shown in FIG. 4B as a function of time 412. The difference curve 416 may be further processed by the processor 120 into a second set of fitting parameters (see below). Characteristics of the environmental electric field may be determined based on the second set of fitting parameters and/or the first set of fitting parameters.

In an alternative optical configuration, the first optical beam 109, the second optical beam 111 and the PL excitation optical beam 115 may be configured as CW optical beams and the measurement of PL emission from the sensor 102 may be made under steady-state. Again, the steady-state PL emission under the influence of the environmental electric field may be compared with a pre-measured reference steady state PL emission without the environmental electric field and pre-stored in the database 122 of FIG. 1. The difference between the steady state PL emission with and without the environmental electric field may be used by the processor to determine the characteristics of the environmental electric field.

FIG. 4 shows another optical configuration 500 as a function of time t (522) that may be used for determining characteristics of the environmental electric field in conjunction with the system configuration of FIG. 1. In particular, the first optical beam 109 for preparing the sensor 102 into the optically bright first charge state may be configured into a first optical pulse 502. The second optical beam 111 for inducing charge conversion (between the optically bright first charge state and the optically dark second charge state) and for inducing the PL emission from the optically bright first charge state may be configured as a sequence of optical pulses, e.g., 512, 514, 516, and 518 following the first optical pulse 502 by a delay of $\Delta_3$. The optical pulses 512-518 may be arranged with a pulse periodicity T 510, corresponding to a pulse frequency F=1/T. The pulse frequency F may be tunable. The optical pulses 512-518 with tunable pulse frequency F may be generated directly from the second optical source 106. Alternatively, these pulses may be generated using optical components external to the second optical source 106 to modulate the optical beams output from the second optical source 106. The PL characteristics, such as the peak PL intensity of the transient PL emission, or differential PL of the PL emission with a reference PL emission from the sensor 102 (denoted as ΔPL) may be monitored as a function of the pulse frequency F.

Figure 6:
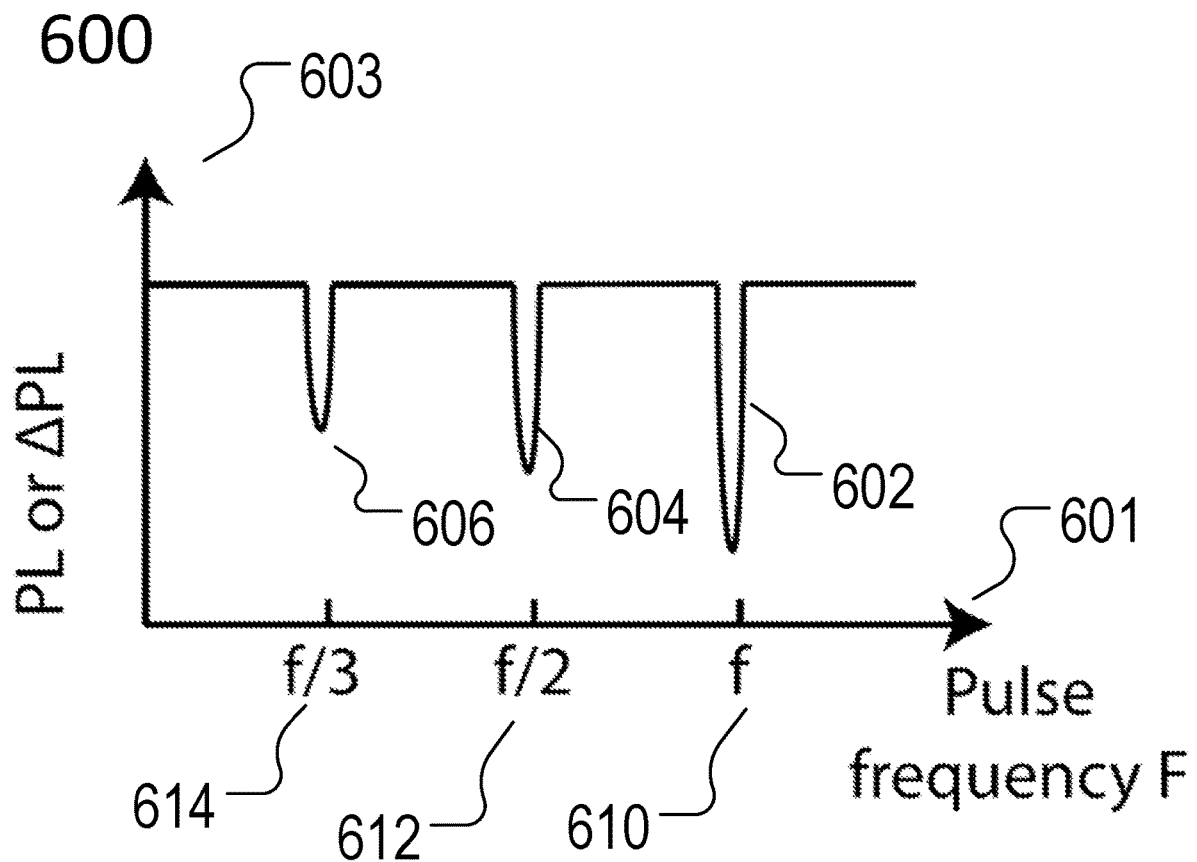
FIG. 6 illustrates another exemplary optical configuration for the electrometry system of FIG. 1.

An example of such measurements 600 is shown in FIG. 6 with the presence of an environmental electric field (showing PL or ΔPL 603 as a function of pulse frequency 601). In FIG. 6, the exemplary environmental electric field comprises a radio-wave or microwave frequency electromagnetic wave with frequency f. FIG. 6 shows dip 602 in the measured PL intensity or ΔPL as the pulse frequency F for the first and second optical beams is tuned or swept. The dip 602 appears at a pulse frequency F=f, 610, corresponding to the frequency of the environmental radio-wave or microwave frequency electric field. Other dips, such as dip 604 and 606 may also be measured at subharmonic frequencies of f, e.g., at f/2 (612) and f/3 (614). As such, the implementation of FIGS. 4 and 6 provide a manner in which the frequency of the environmental radio-wave or microwave frequency electric field may be determined, in addition to its magnitude as described above.

FIG. 7 shows a logic flow 700 for an exemplary implementation of determining one or more characteristics of an environmental electric field using the system configuration of FIG. 1. In logic block 702, an electrometry sensor is disposed or present in an environment having an environmental electric field. The electrometry sensor may comprise a semiconductor lattices having at least one vacancy. In logic block 704, the sensor is optically prepared into an optically bright (or dark) charge state associated with the vacancy. In logic block 706, charge conversion between the optically bright (or dark) charge state associated with the vacancy and an optically dark (or bright) charge state associated with the vacancy is induced optically. In logic block 708, photoluminescence is induced from the optically bright charge state and at least one characteristics of the photoluminescence is monitored. In logic bock 710, the measured characteristics of the photoluminescence emitted from the sensor is compared with a corresponding pre-measured reference characteristics of a reference photoluminescence emitted by the sensor. The reference characteristics of the reference photoluminescence may be pre-measured following logic blocks 704, 706, and 708, but without the presence of the environmental electric field. The pre-measured reference characteristics of the reference photoluminescence may be stored in a database. In one implementation for the logic block 710, a difference between the measured characteristics of the photoluminescence and the reference characteristics of the reference photoluminescence may be obtained. In logic block 712, the one or more characteristics of the environmental electric field are determined according to the difference obtained in the logic block 710.

Figure 8:
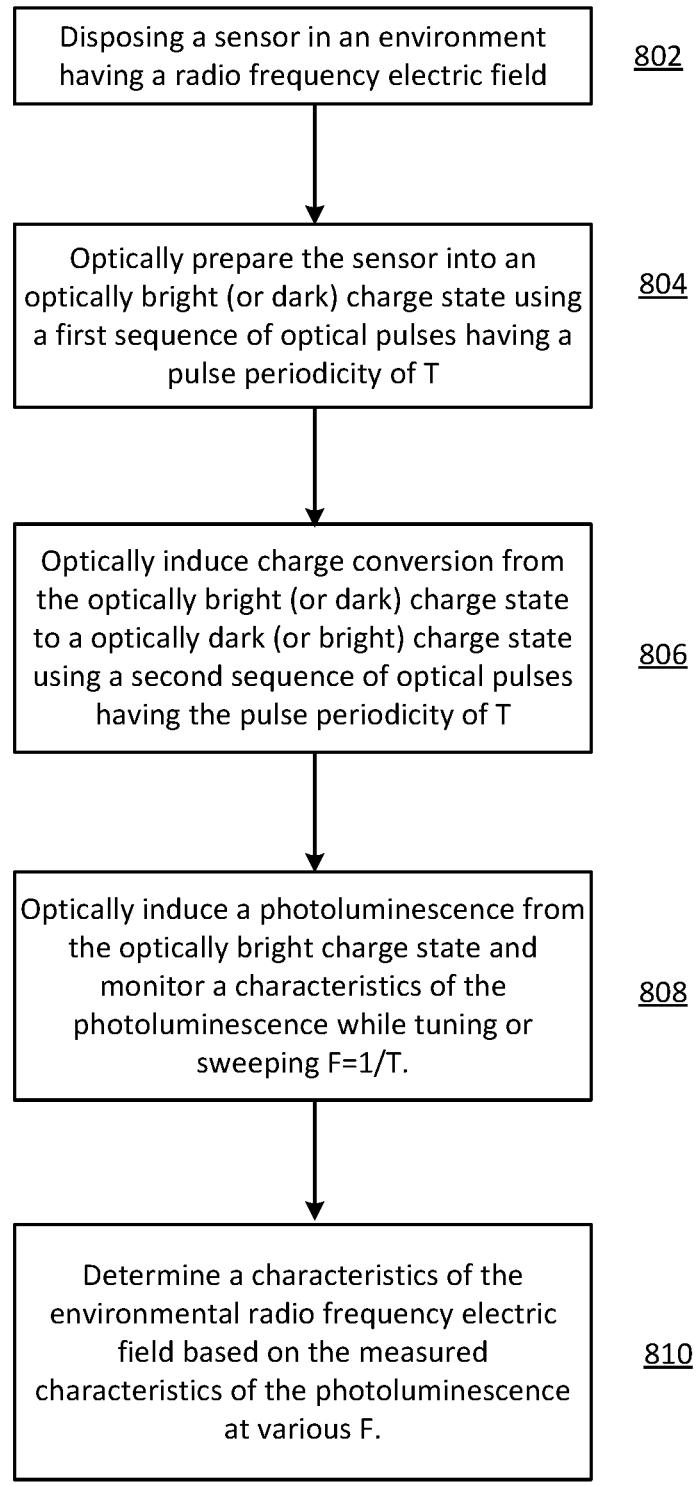
FIG. 8 shows another logic flow for sensing an environmental electric field using the electrometry system of FIG. 1.

FIG. 8 shows a logic flow 800 for an exemplary implementation of determining a characteristics of an environmental radio-wave or microwave frequency electric field using the system configuration of FIG. 1. In logic block 802, an electrometry sensor is disposed in an environment having the environmental radio-wave or microwave frequency electric field. The electrometry sensor may comprise a semiconductor lattice having at least one vacancy. In logic block 804, the sensor is optically prepared into an optically bright charge state associated with the vacancy using a first sequence of optical pulses having a pulse periodicity of T. In logic block 806, charge conversion between the optically bright charge state associated with the vacancy and an optically dark charge state associated with the vacancy is induced optically using a second sequence of optical pulses having the pulse periodicity of T. In logic block 808, photoluminescence is induced from the optically bright charge state and the characteristics of the photoluminescence is measured while tuning or sweeping F=1/T. In block 810, a characteristics of the environmental radio-wave or microwave frequency electric field, such as its frequency, is determined based on the measured characteristics of the photoluminescence at various F.

In the implementations above, the charge conversion is optical induced or controlled between optically bright state and optically dark state. Such charge conversion may be affected by the presence of the environmental electric field. As a result, the environmental electric field may then modify the photoluminescence from optically bright state. Such effect on photoluminescence may be monitored to determine the amplitude, frequency, or other characteristics of the environmental electric field. In some other implementations, conversion may be optically induced between two optically bright states. Such conversion may similarly be affected by the presence of the environmental electric field. The two optically bright states may produce photoluminescence of different characteristics (for example, in intensity and/or wavelength). By monitoring the characteristics of the photoluminescence from one or both of the two optically bright states, the characteristics of the environmental electric field may be determined based on similar underlying principles discussed above.

The electrometry sensor above is based on the effect of an electric field being sensed on the charge conversion between optically bright state and dark state in the sensor, and such effect is detected by monitoring photoluminescence emission from the optically bright charge state. In some implementations, the effect of the electric field on the photoluminescence may be non-linear as a function of the amplitude of the electric field, particularly when the electric field is small. For example, differential photoluminescence (with and without the electric field) in some electrometer sensors described above may depend quadratically on the amplitude of the electric field. As such, the detection configuration of FIG. 1 may not provide an electrometry sensor having a linear response as a function of the amplitude of the electric field being sensed.

Figure 9:
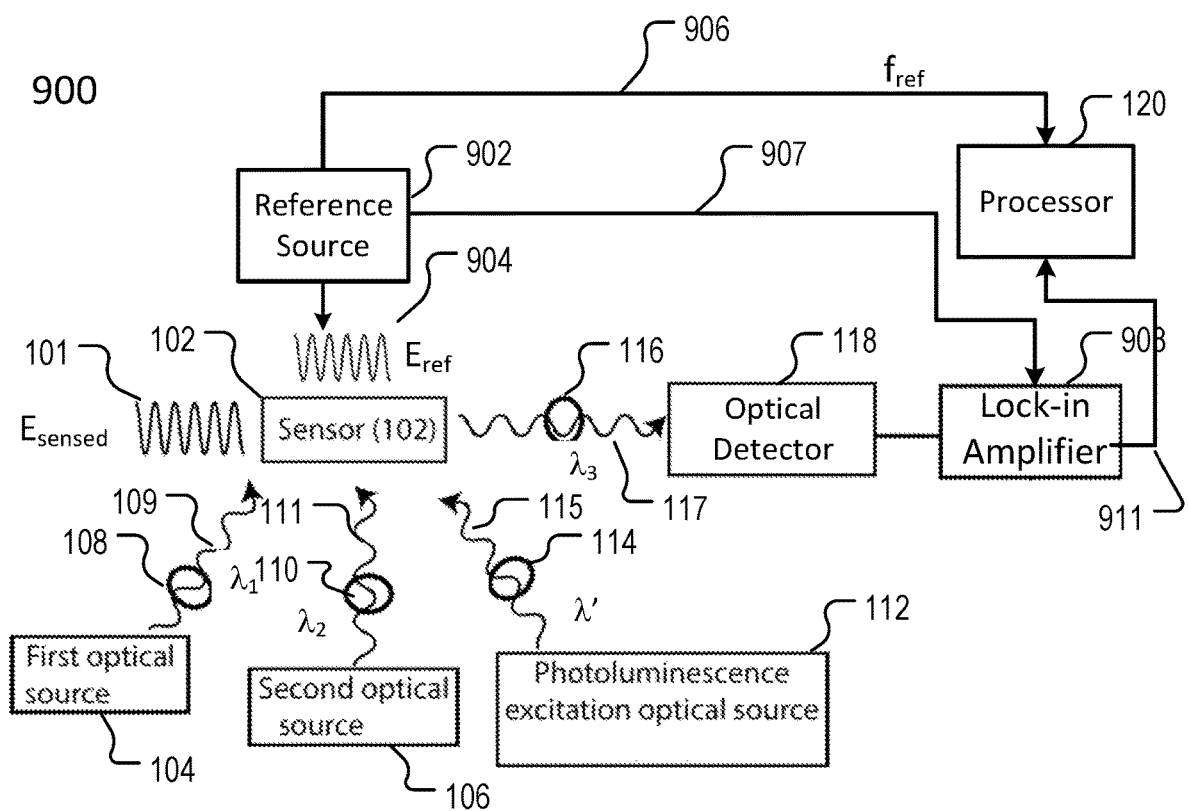
FIG. 9 illustrates an exemplary electrometry system for sensing and detecting an environmental electric field based on a heterodyne detection configuration.

In some implementations alternative to FIG. 1, the electrometry sensor and the detection configuration may be modified to provide a desired linear response. An exemplary modified detection configuration for detecting electric field $E_{sensed}$ (101) at a frequency $f_{sensed}$ is shown in FIG. 9. The detection configuration of FIG. 9 is similar to FIG. 1, except that (1) an additional reference electric field $E_{ref}$ (904) at frequency $f_{ref}$ from source 902 is applied to the electrometry sensor 102 such that the electrometry sensor is exposed to both the electric field being sensed, $E_{sensed}$ (101), and the reference electric field 904, (2) a lock-in amplifier 908 is used for analyzing the photoluminescence 117 detected by the optical detector 118, (3) signal 911 detected from the lock-in amplifier 908 may be further processed by computer processor 120, (3) an auxiliary signal 906 indicating the frequency $f_{ref}$ of the reference electric field $E_{ref}$(904) may be provided to the processor 120, and (4) in come implementations (coherent heterodyne detection described below), a second auxiliary signal 907 indicating the phase of the reference electric field $E_{ref}$ (904) may be provided to the lock-in amplifier. As will be shown in more detail below, the addition of the reference electric field $E_{ref}$ (904) to the electrometry sensor may provide the desired detection linearity by implementing a heterodyne detection configuration.

For example, the differential photoluminescence 117 detected by the optical detector 118 may be quadratic to the amplitude of the total electric field present in the sensor, including both the electric field being sensed $E_{sensed}$ (101) and the reference electric field $E_{ref}$ (904):

$$\Delta PL \propto |E_{sensed}\exp(i2\pi f_{sensed}t)+E_{ref}\exp(i2\pi f_{ref}t+\phi)|^2 = |E_{sensed}|^2+|E_{ref}|^2+2E_{sensed}E_{ref}\cos(2\pi\Delta ft+\phi). \quad (1)$$

where $\Delta f$ denotes the difference or beat frequency between $f_{sensed}$ and $f_{ref}$, t represents time, and $\phi$ represents the phase difference between the electric field $E_{sensed}$ (101) and the reference electric field $E_{ref}$ (904).

The differential photoluminescence thus may include a component at the beat frequency $\Delta f$, with an amplitude being the inner product of the amplitudes of the electric field $E_{sensed}$ (101) and reference electric field $E_{ref}$ (904). The lock-in amplifier 908 may then be used as a narrow band filter to isolate this photoluminescence component at the beat frequency $\Delta f$ and this photoluminescence component would be a linear function of the amplitude of the electric field being sensed $E_{sensed}$ (101). The filter bandwidth of the lock-in amplifier corresponds to an integration time constant of the lock-in amplifier. The integration time constant may be adjusted to any values. For example, the integration time constant may be 1 ms to 10 seconds. For a particular example, the integration time constant may be 50 ms, corresponding to a FWHM filtering bandwidth of ~6.5 Hz. Using the lock-in amplifier 908 as a narrow band filter is merely one example. Other alternatives may be used. For example, the photoluminescence signal from the optical detector 118 may be input into an analog to digital converter and the converted digital signal may be processed using a computer-implemented numerical filter having a desired filtering bandwidth.

Figure 10A:
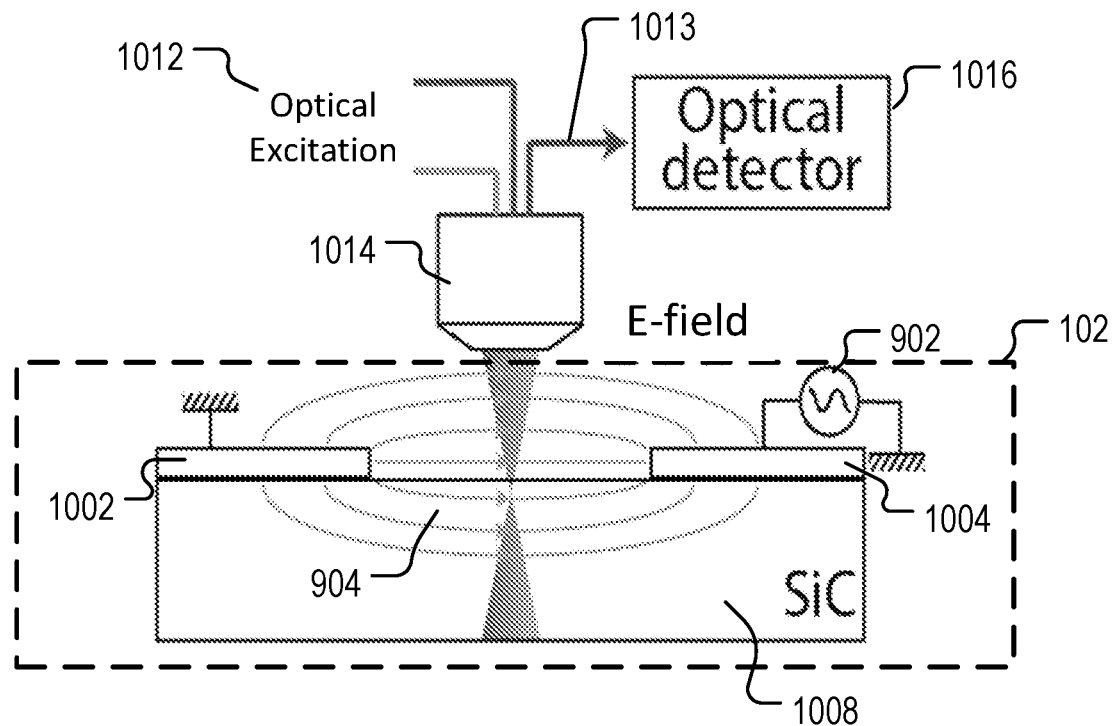
FIGS. 10A-10B illustrates exemplary electrometry sensor configurations for use in heterodyne detection.

Some implementations for the electrometry sensor 102 of FIG. 9, as shown in more detail in FIG. 10A, may include integrated electrodes for applying the reference electric field $E_{ref}$(904). As such, the electrometry sensor 102 may include lattice host 1008 with defect states supporting charge conversion (such as the material system shown in FIG. 2) and integrated pair of electrodes 1002 and 1004 for applying the reference electric fields 904. For example, electrode 1002 may be connected to ground whereas electrode 1004 may be connected to source 902. In some alternative implementations, a 180-degree hybrid splitter may be used to alternate positive and negative potential at electrodes 1002 and 1004 rather than having one of the electrodes always at ground. The electrodes 1002 and 1004 may be integrated with the lattice host 1008 using current and future technologies for growing, depositing, and patterning electrodes. During operation of the electrometry sensor 102, the electric field being sensed (not shown in FIG. 10A) would be in co-existence with the reference electric field $E_{ref}$ (904). As described above, the electrometry sensor 102 may be optically prepared, charge-transferred, and optically excited using optical excitation 1012. Photoluminescence 1013 may be detected by optical detector 1016, which is then sent to the lock-in amplifier as depicted in FIG. 9.

Figure 10B:
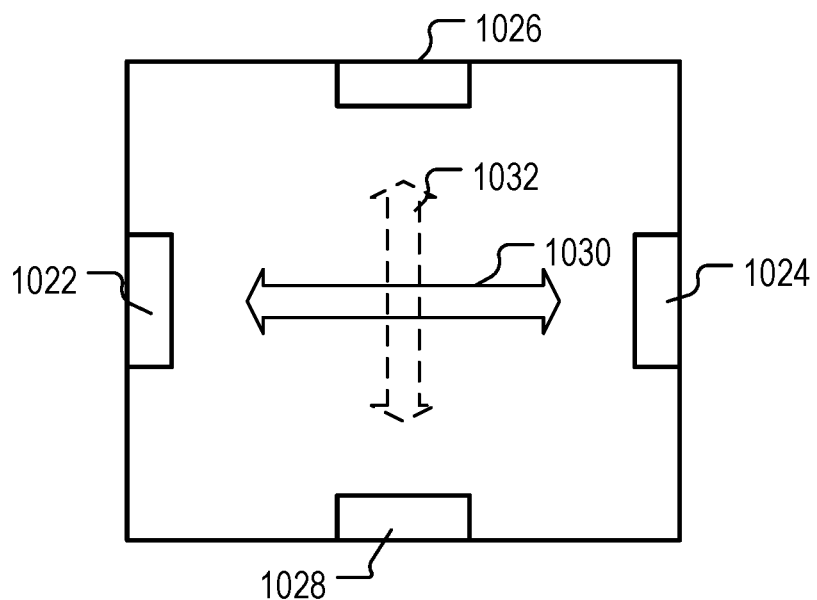

The in-plane direction of the reference electric field $E_{ref}$ (904) may be determined by the in-plane positions of the electrodes, as shown in an in-plane view of the electrodes in FIG. 10B. FIG. 10B shows that a pair of electrodes 1022 and 1024 may be used to apply a reference electric field in the orientation shown by 1030, whereas a pair of electrodes 1026 and 1028 may be used to apply a reference electric field in the orientation shown by 1032. As shown by Equation (1) above, the photoluminescence at the beat frequency Δf is non-zero when the electric field $E_{sensed}$ being sensed and the reference electric field $E_{ref}$ are not normal to each other and would be at maximum when $E_{sensed}$ and $E_{ref}$ are aligned along the same orientation. In other words, the electric fields in Equation (1) may be considered as vectors and the inner product of the electric fields $E_{sensed}$ and $E_{ref}$ is non-zero only when the electric fields are not orthogonal to each other. As such, for maximum detection signal for the photoluminescence component at the beat frequency, multiple electrode pairs may be integrated into the electrometry sensor such that the electrometry sensor may be capable of applying reference electric field in various in-plane orientations. For example, the electrodes may be arranged and segmented in a circular fashion around the detection region of the electrometry sensor surrounded by the electrodes. In some other implementations, the electrodes may be disposed on the back side of the sensor, particularly when the sensor is sufficiently thin. Such electrode configuration may be used to apply out-of-plane reference field. When the electrometry sensor is in operation, a pair of electrodes may be chosen (depending on the orientation of $E_{sensed}$) to obtain maximum photoluminescence component at the beat frequency. In some other implementations, the configuration of the electrodes may not be limited to in-plane configuration. For example, the electrode pairs may be arranged in three spatial dimensions. As such, an electrode pair may be chosen for applying the reference electric field that is aligned with the electric field being sensed in any orientation in three-dimensional space. In some other implantations of the electrometry sensor, the electrodes may be configured as shown in the in-plain configuration of FIG. 10B, or in a configuration where a single pair of electrodes are used, and such electrometry sensor may be mounted on, e.g., a piezoelectric platform that may be used to orient the electrometry sensor such that the reference electric filed is aligned to the electric field being sensed for obtaining maximum photoluminescence component at the beat frequency.

Figure 11:
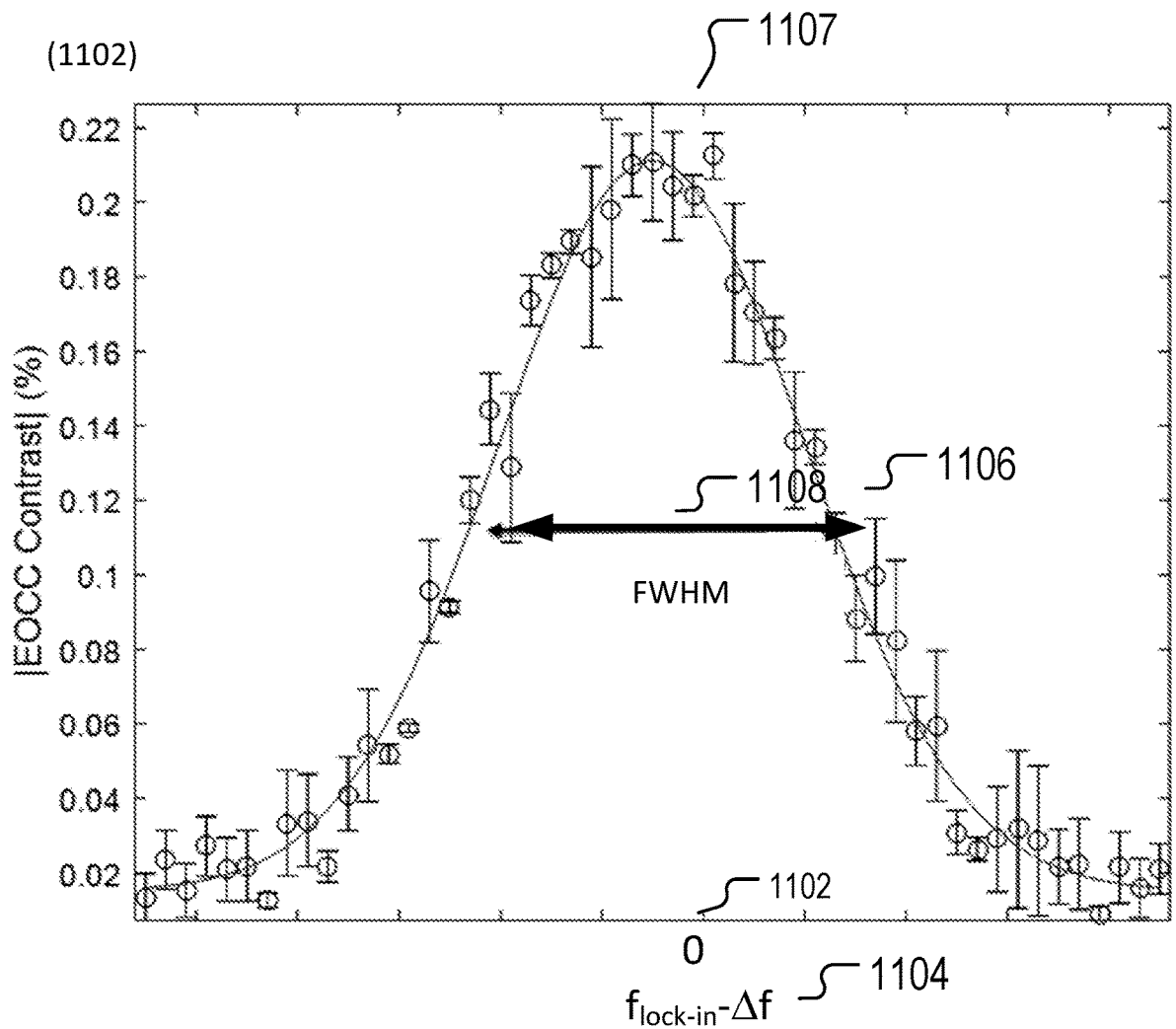
FIG. 11 illustrates exemplary heterodyne detection response at a beat frequency.

When the electrometry sensor of FIG. 9 is in operation, the lock-in amplifier detects signal from the optical detector 118 centered at a lock-in frequency equal to Δf (or $f_{lock-in}$−Δf=0), and the signal tails off on either frequency side according to the filtering bandwidth (or integration time constant) of the lock-in amplifier, as shown in FIG. 11. In one implementation, the lock-in amplifier may be set at a fixed detection frequency $f_{lock-in}$ and measurements may be made as the frequency $f_{ref}$ of the reference electric field $E_{ref}$ is tuned to obtaining the curve 1106 in FIG. 11. The signal reaches maximum 1107 when Δf=$f_{ref}$−$f_{sensed}$ equals $f_{lock-in}$, as shown by 1102 and 1104, and falls off beyond the filtering bandwidth of the lock-in amplifier on either frequency side of the maximum 1107, as shown by the FWHM 1108. For example, $f_{lock-in}$ may be fixed at 397 Hz, the integration time constant for the lock-in amplifier may be adjusted to 50 ms (corresponding to a FWHM filtering bandwidth of 6.5 Hz), and the $f_{sensed}$ may be 68 MHz. When the $f_{ref}$ is tuned, the lock-in amplifier may detect maximum signal at an $f_{ref}$ of 68 MHz+397 Hz (or 68 MHz−397 Hz), with a FWHM of about 6.5 Hz.

In another alternative implementation, frequency $f_{ref}$ of the reference electric field may be fixed while the lock-in detection frequency $f_{lock-in}$ is tuned. Similar curve 1108 may be obtained with maximum signal when $f_{lock-in}$ is tuned to a frequency such that $f_{lock-in}$−Δf=0.

In any of the implementations above according to FIG. 11, the detected signal level from the lock-in amplifier is linear to the amplitude of the electric field $E_{sensed}$ being sensed. The total photoluminescence detected by the photodetector 118 of FIG. 9 includes not only the differential photoluminescence (with and without electric field) but also the background photoluminescence generated by the input optical excitation without the electric fields. However, such background photoluminescence would not be at the beat frequency Δf and would at most contribute as some noise to the signal detected by the lock-in amplifier 908. Such noise may be minimized by increasing the integration time constant (or reducing the filtering bandwidth) of the lock-in amplifier.

As such, the amplitude of $E_{sensed}$ can be sensed with linearity. In addition, the frequency $f_{sensed}$ can be determined as shown in FIG. 11 by tuning $f_{lock-in}$ or $f_{ref}$. The measured signal is also linear with the amplitude of the applied reference electric field, thereby providing another convenient tuning knob for the measurement. For example, tuning of the characteristics of the reference electric field may enables tuning of a dynamic range of the sensor, i.e. the optimal range of electric field that can be detected (see description below with respect to FIG. 17B). Further, as shown in FIG. 10b and described above, the orientation of $E_{sensed}$ may be determined, by a multi-electrode configuration or by scanning the orientation of the electrometry sensor in time. In some implementations, multiple pairs of electrodes of FIG. 10B may be used to apply reference electric fields of different frequencies. In such a manner, different orientations would be associated with corresponding different beat frequencies for measuring electric field along each of the orientations simultaneously.

In the above description associated with FIGS. 9-11, Equation (1) has been assumed. In other words, it has been assumed that the differential photoluminescence is quadratic to the amplitude of the electric fields. However, the implementations above may also be applicable to other type of nonlinear photoluminescence response (e.g., cubic, or a mixture of quadratic and cubic, etc.). The lock-in amplifier would isolate the photoluminescence signal component at the beat frequency between the electric field being sensed $E_{sensed}$ and the reference electric field $E_{ref}$. Such photoluminescence signal component would be linear with respect to $E_{sensed}$.

In some other implementations, the heterodyne detection above may be further modified to utilize a coherent heterodyne detection, where, in addition to the frequency relation, there may be also a known phase relation between the reference electric field and electric field being sensed (phase φ in Equation (1)). In particular, if this φ is not random, that is, the phase of the electric field being sensed can be known (for example if the electric field being sensed can be driven or triggered), then the sensitivity of the detection will be even higher. It allows more efficient averaging of the signal than for random phase. The phase also corresponds to the relative direction (sign) in addition to just orientation between sensed and reference electric field. Without this known phase, it is possible to know the orientation but not the sign of the vectors in space for the electric field. Coherent heterodyne could therefore allow real 3D vector imaging with high sensitivity.

Figure 12:
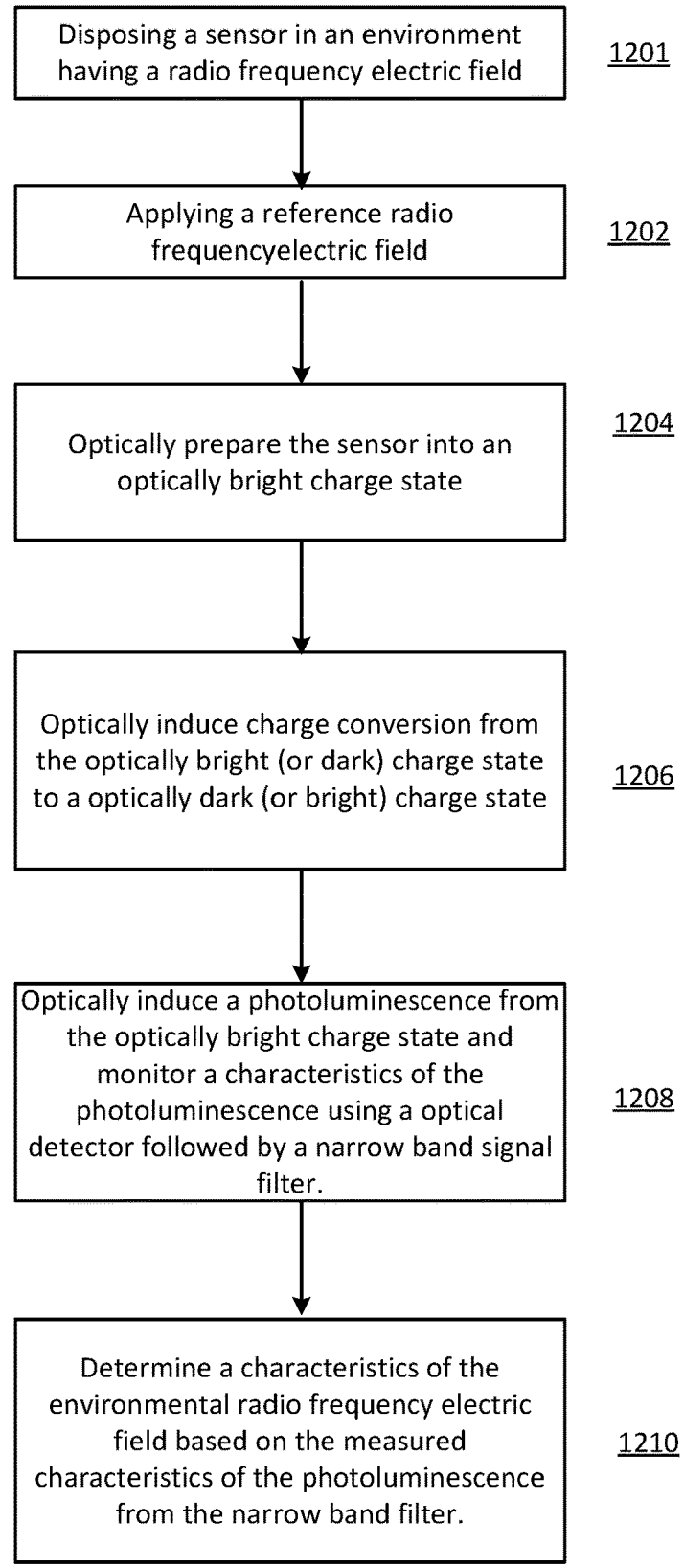
FIG. 12 shows a logic flow for sensing an environmental electric field using the electrometry system of FIG. 9.

FIG. 12 illustrates an exemplary logic flow 1200 for the implementations of FIGS. 9-11. In step 1201, the electrometry sensor is disposed in an environment having an electric field to be sensed. In step 1202, a reference electric field is applied to the environment via, for example, the electrometry sensor, in addition to the electric field being sensed. In step 1204, the electrometry sensor is optically prepared into an optically bright charge state. In step 1206, charge conversion is induced from the optically bright (or dark) charge state to the optically dark (or bright) charge state in the electrometry sensor in the presence of both the electric field being sensed and the reference electric field. In step 1208, photoluminescence from the optically bright charge state in the electrometry sensor is induced and monitored by an optical detector. The signal detected by the optical detector is further processed by a narrow band filter such as a lock-in amplifier. In step 1210, the signal derived from the narrow band filter is further processed to obtain various characteristics of the electric field being sensed as described above in with respect to FIGS. 9-12.

More details, including various characterization, measurements, and application of the electrometry system above in exemplary material systems are described below.

Charge state of defects in semiconductor may be optically detected using the methods and systems described herein. For example, for nitrogen-vacancy (NV) center in diamond, a change from the $NV^-$ to the $NV^0$ provides different emission spectra, while in VV or silicon vacancies ($V_{Si}$) in 4H and 6H-SiC, only one charge state ($VV_0$, $V_{Si}^-$) has a PL spectrum. Charge conversion between the various charge states can be efficiently realized by optical pumping at specific wavelengths. This change in PL due to optical charge conversion (OCC) rate between the bright and dark charge states of both VV and $V_{Si}$ defects may be modulated by the presence of an applied radio-wave frequency (RF) or microwave (MHz to GHz) electric field, which can therefore be measured by photoluminescence. The frequency range of this electrometry by OCC, or electrometry by OCC (EOCC), would be extremely challenging using spin sensing. In general, a defect may have two charge states (which can both be optically bright, as an alternative to the optically bright and dark charge state combination shown as an example above) associated with different PL; a change in PL due to optical charge conversion (OCC) rate between the two charge states of the defect may be modulated by the presence of an applied radio-wave frequency (RF) or microwave (MHz to GHz) electric field, which can therefore be measured by photoluminescence.

Figure 13A:
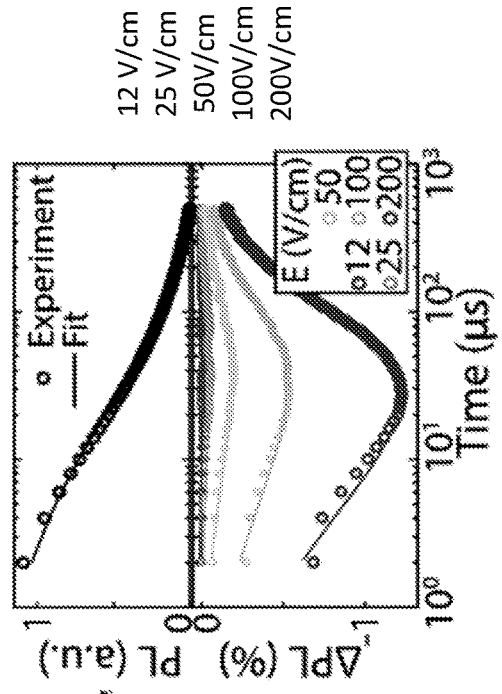
FIGS. 13A-13D illustrate experimental configuration and measured characteristics of an electrometry sensor based on deep defects in a semiconductor.

In an exemplary host material of 4H-SiC, OCC of divacancy ensembles may be realized using a near or above bandgap (3.2 eV) excitation to efficiently obtain $VV^0$ (bright), while an illumination below 1.3 eV pumps the defect toward a dark charge state, either $VV^-$ or $VV^+$. For example, 365 nm (continuous) or 405 nm (pulsed) optical excitation from a laser may be used for excitation of the defects into the bright charge state and 976 nm optical excitation from a laser may be used for OCC from the bright charge state to the dark charge state. The 976 nm laser also exciting PL from $VV^0$. A schematic of the setup is shown in FIG. 13A, where the two laser beams are focused at a divacancy layer (carbon implantation) between two metal contacts on top of the SiC substrate.

Figure 13B:
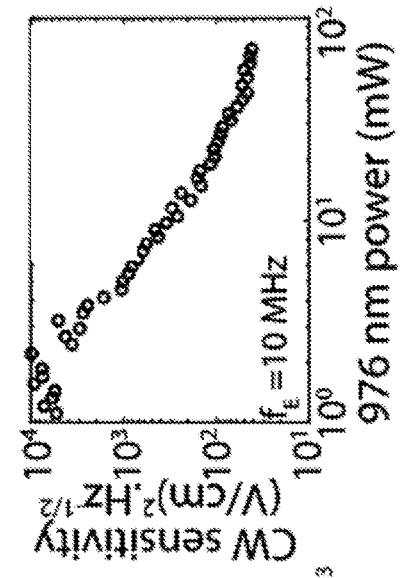

In one exemplary implementation, to characterize and detect OCC transient decays due to the 976 nm pumping immediately following reset by 405 nm, a fast photo detector is used to capture a complete transient from bright to dark in a single measurement, as shown in the top panel of FIG. 13B. The decay may be fitted by a simple stretch exponential decay $f(t) \propto \exp(-(Rt)^n)$, where R is the characteristic decay time and n the stretch factor, the latter describing the complexity of the charge conversion mechanism (n=1 for simple photoionization and n<1 for competition between ionization, carrier capture and carrier diffusion). An RF electric field E (root mean square amplitude, frequency $f_E$=10 MHz) is then applied during the 976 nm illumination. The PL difference (ΔPL) with electric field minus is plotted in the bottom panel of FIG. 13B.

Figure 13C:
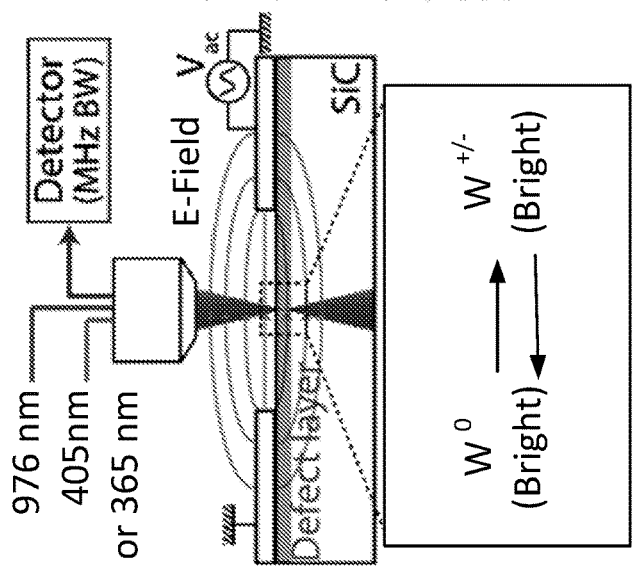

The transients may be fitted by shifts, for example in the conversion rate R and with n being fairly constant (~1% shift). Shifts in R are shown as a function of E in FIG. 13C and may follow a quadratic dependence with saturation such that $$\Delta R(E) = \Delta R_\infty \langle (E/E_{sat})^2 / (1+(E/E_{sat})^2) \rangle_t \quad (2)$$

where $\langle \rangle_t$ correspond to a time average over an oscillation of the RF electric field, $\Delta R_\infty$ is the maximum R shift when $E \gg E_{sat}$. In this exemplary implementation, $\Delta R_\infty$=27±1% and $E_{sat}$=158±20 V/cm. These values may be specific to the sample or to the defect itself. EOCC would be likely due to variations in carrier recapture after ionization and would depend on parameters such as electron mobility or drift velocity. $E_{sat}$ may be directly related to the defect potential and changes in photoionization and capture cross-sections.

Figure 13D:
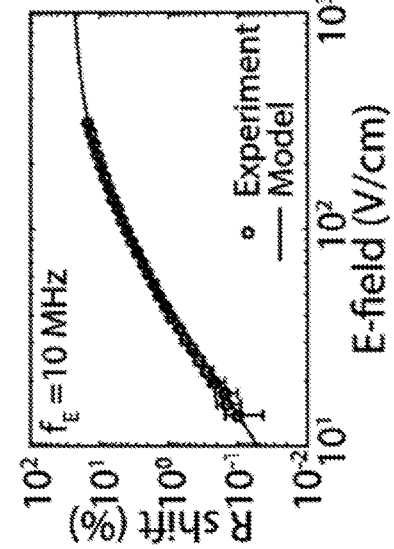

From the quadratic response given by Equation (2), the sensitivity of this sensing technique to electric field can be defined as:

$$S = (E^2 \sigma_{\Delta PL}(E)(T_{exp})^{1/2}(\Delta PL(E)) \quad (3)$$

where $\Delta PL/\sigma_{\Delta PL}$ is the signal-to noise ratio (using standard deviation) for a given electric field (below saturation) and $T_{exp}$ is the experiment time. In FIG. 13D, this sensitivity is measured as a function of the 976 nm pump power. For better sensitivity, the measurement is realized with continuous 976 nm and 365 nm (replacing the 405 nm) illumination while locking-in on the electric field turned periodically on and off. For this particular implementation, sensitivity at 10 MHz is measured as low as 41±8 $(V/cm)^2$ $Hz^{-1/2}$ for an estimated ensemble of $10^4$ VVs within the confocal spot size.

The frequency response of the EOCC technique is shown in FIG. 14A where the rate shift from transient experiments are fitted and plotted as a function of frequency, from low frequency AC (100 Hz) to microwave frequencies (2 GHz). Above 1 GHz, the rate shift from electric field decreases from parasitic capacitances (RC filtering). Below 1 MHz, a decrease in rate shift is also observed and may be attributed to the creation of a space charge under illumination and electric field. At low frequency, when defects are ionized the resulting carriers are distributed such that they compensate the local electric field. At high enough frequency, the distribution never reaches its steady state and the space charge is not created. The characteristic timescale for space charge formation is the Maxwell relaxation time $(1/f_M) = \varepsilon_0 \varepsilon_r \rho/2$, where $\varepsilon_0$ and $\varepsilon_r$ ($\approx$10 for 4H-SiC) are the vacuum and relative permittivity and $\rho$ is the resistivity. Within this description and using a fitting function for $f_M$, the resistivity may be estimated to be $\approx 10^7$ Ωcm. The space charge creation may be dependent on the initial charge distribution which may be modified by increasing the spot size.

In a further implementation, frequency and phase of the applied RF electric field may be sensed and resolved as shown in FIGS. 14B and 14C. This is enabled by pulsing the 976 nm pump light with a given frequency $f_{laser}$ and duty cycle. First, $f_{laser}$ is fixed while $f_E$ is swept with a random initial phase between the two frequencies. This sequence provides a measure of the effective filter function of the pulse sequence, showing dips of decreasing intensities for $f_E$ equal to increasingly higher harmonics of $f_{laser}$ (FIG. 14B). The dips may be explained by the fact that, even with random phase, the light pulse always encounters the same value of the electric field when $f_E$ matches a harmonic of $f_{laser}$. The RF electric field effectively becomes DC and the EOCC signal diminishes as expected from FIG. 14A. The effect is increasingly prominent for decreasing duty cycle and the filter function sharpens. For phase resolution (FIG. 14C), the laser pulse and electric field oscillations have a fixed phase relative to one another, and $f_{laser}=2f_E$. Alternating light pulses encounter electric fields with alternating signs but equal amplitude depending on the phase. Hence, the electric field ($E^2$) oscillation in time can be directly mapped by sweeping the relative phase with the pulsed laser. The model in the figure may be directly calculated without any free parameter using Equation (2) and the overlap between the electric field wave and the laser pulse.

Figure 15A:
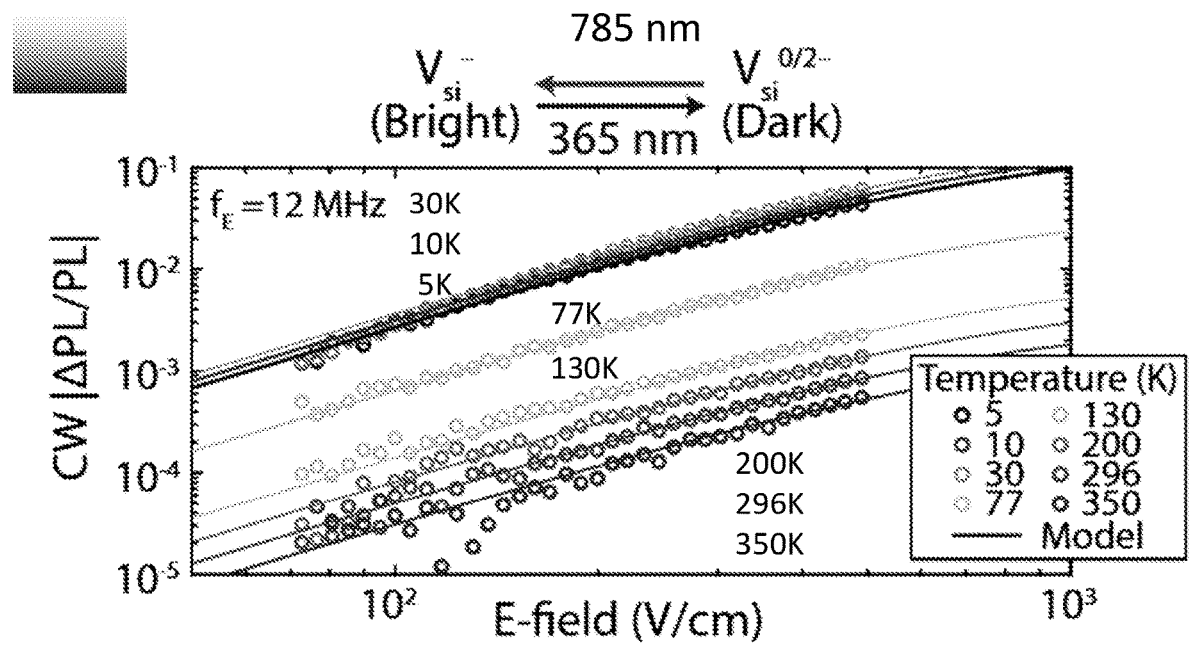
FIGS. 15A-15B show further measured characteristics of an electrometry sensor based on deep defects in a semiconductor.
Figure 15B:
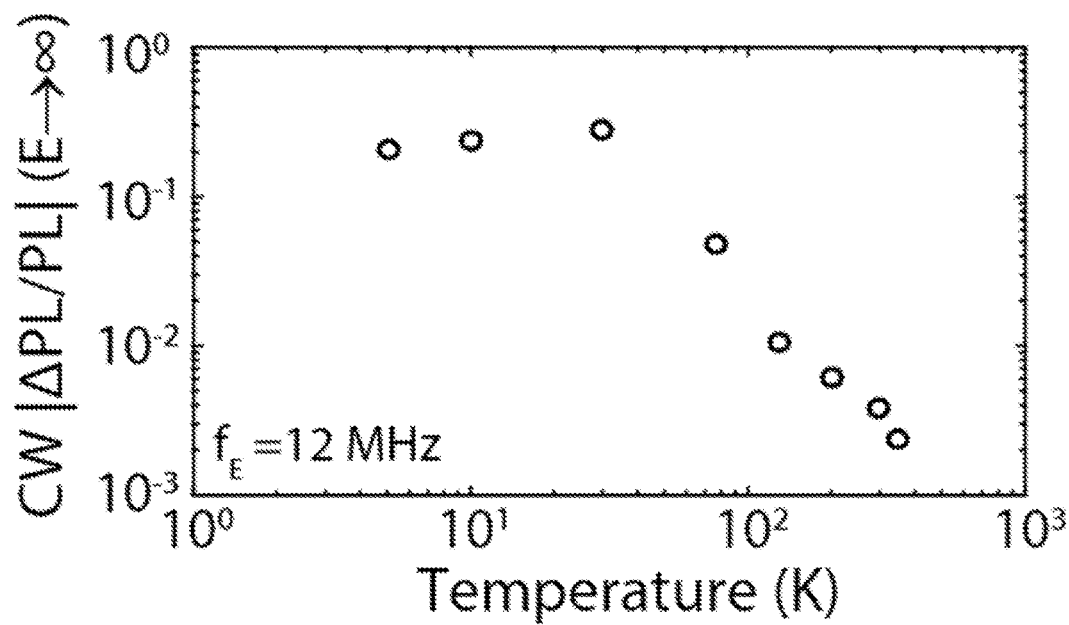

While the discussion above focuses on EOCC characterization for ensembles of VV in 4H-SiC, the underlying implementations and techniques may be generalizable to other defects. For example, silicon vacancy $V_{Si}$ in 4H-SiC, may be optically active up to room temperature. The combination of a 365 nm (pump to the dark state) and a 785 nm (pump to the bright state) excitation may be used for charge conversion, and may therefore be used for EOCC as shown in FIGS. 15A and 15B. The change in PL (continuous illumination) as a function of electric field is plotted in FIG. 15A as a function of electric field for temperatures from 5 K to 350 K. The data may fitted by the processor 120 according to Equation (2), and the PL change for E→∞ is plotted as a function of temperatures in FIG. 15B. The EOCC signal may be measured at all temperatures with a drastic reduction above 30-77 K. This behavior may be explained by the thermal activation of shallow impurities or capture barriers for example.

Figure 16A:
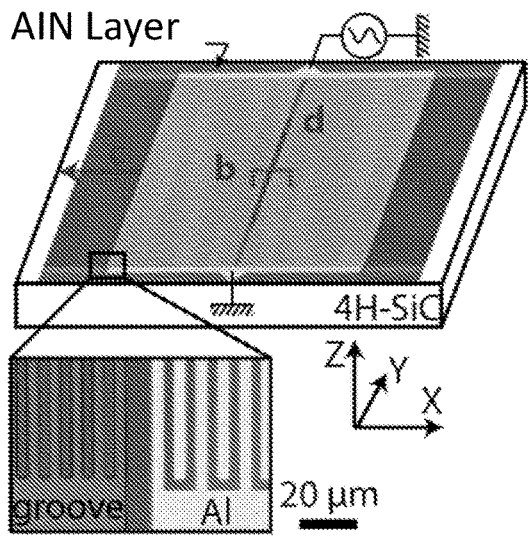
FIGS. 16A-16D show an exemplary application of the electrometry system of FIG. 1 for measuring piezo electric field in a surface acoustic wave device.
Figure 16B:
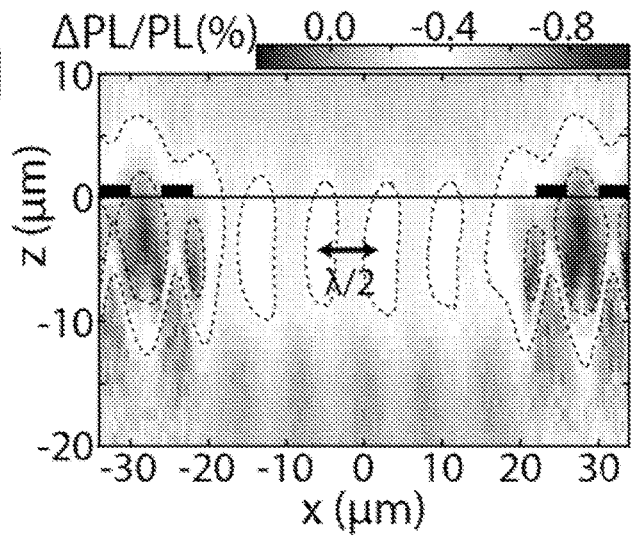
Figure 16C:
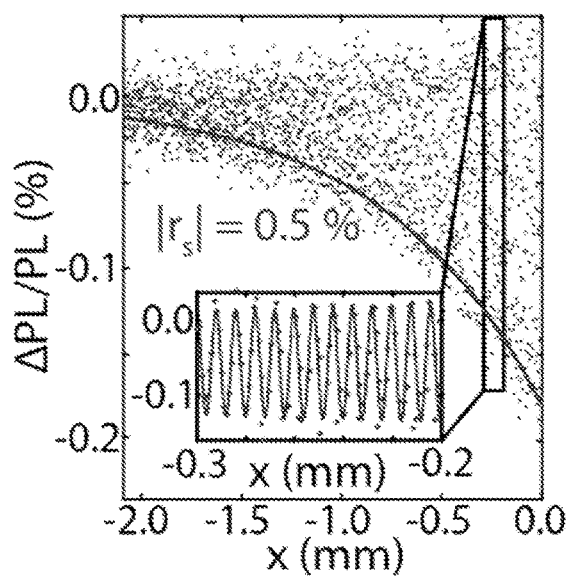
Figure 16D:
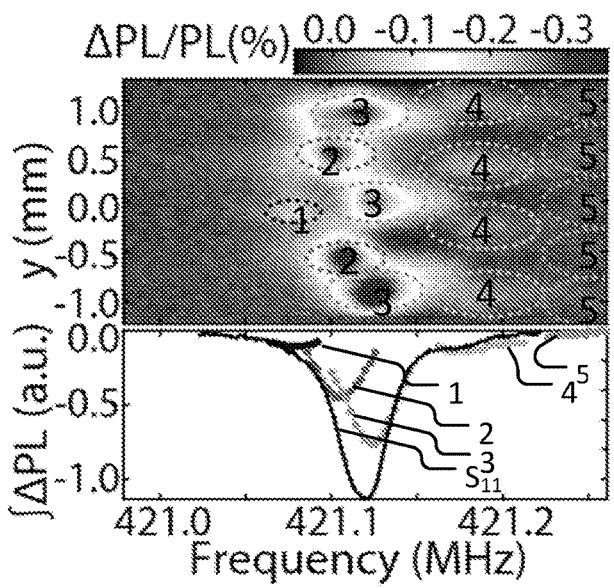

In another implementation, EOCC discussed above may be applied to map surface acoustic wave (SAW) modes in an electro-mechanical resonator in 4H-SiC. The mapping may be implemented by detecting the electric field and piezo-electrically induced by a strain field using the electrometry method above. An example of the resonator is shown in FIG. 16A with an interdigital transducer (IDT) fabricated on top of a 500 nm AlN layer on top of the SiC substrate. The resonator is composed of Bragg gratings made from grooves in the AlN that act as reflective mirrors, while the IDT couples the electrical drive to the SAW mode. FIGS. 16B, 16C and 16D respectively show a longitudinal (x-z) cross-section in the center of a device where there is a window in the IDT, a cut (x) across the AlN grooves and a transverse cut (y) in the central window. In the cross-section, wave crests separated by half of the wavelength λ (λ=16 μm, cavity frequency is 421 MHz) may be observed within the window, due to, for example, a quadratic response in electric field. In FIG. 16C, the cut through the grooves shows oscillations from the SAW modulated by an exponential decay. In this particular implementation, the characteristic decay length into the Bragg grating is measured to be L=0.78±0.03 mm, and directly related to the reflectivity per grating strip $|r_s|=\lambda/4L=0.51\pm0.02\%$.

In FIG. 16D, a transverse cut is shown as a function of drive frequency of the cavity, allowing for observation of the transverse modes of this implementation of the SAW resonator. Modes with 1 to 5 peaks are observed. Their total signal may be separately integrated, plotted in the bottom panel of FIG. 16D, and compared with a direct RF reflection ($S_{11}$) measurement of the cavity. The $S_{11}$ signal shows the total contribution from all modes, whereas the EOCC implementation is able to fully separate these contributions. EOCC may therefore provide complementary information (to displacement) to common MEMS characterization methods such as laser Doppler vibrometry and various surface techniques (scanning electron microscope, atomic force microscopy, etc.).

FIG. 17A shows a typical nonlinear relationship 1702 between the measured EOCC and the amplitude of the electric field being sensed using the detection implementations of FIGS. 1-8 (standard detection). However, by using the heterodyne detection implementations of FIGS. 9-12, the measured and filtered EOCC becomes linear as a function of the amplitude of the electric field being sensed above the noise floor, as shown in FIG. 17B. In particular, FIG. 17B shows the relationship between the EOCC in log scale and power of the electric field in dBm as a linear relationship with a slope of ½₀, which corresponds to linear relationship between EOCC in linear scale and amplitude of the electric field in linear scale. FIG. 17B further shows heterodyne EOCC measurements under different amplitudes for the reference electric field, as indicated by 1704 (18 dBm), 1706 (13 dBm), and 1708 (8 dBm). FIG. 17B shows that at higher reference electric field, such as in 1704, in comparison to lower reference electric field, such as 1708, lower amplitudes for the electric filed being sensed can be measured in the presence of noise, providing larger or shifted measurement dynamic range, as shown by region 1710 of FIG. 17B.

Figures 18A, 18B:
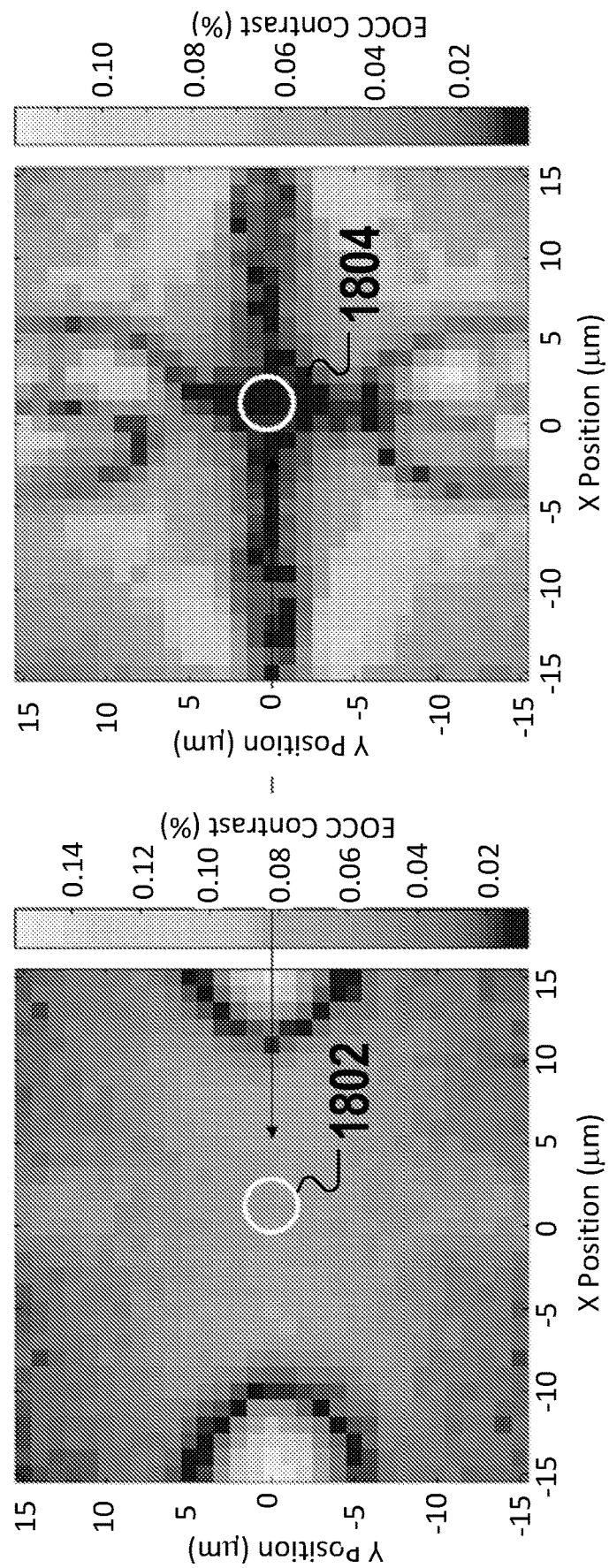
FIGS. 18A-18B show comparison of exemplary heterodyne detection results between parallel and orthogonal reference electric field and electric field being sensed.

FIGS. 18A and 18B show heterodyne detection measurements for an electrometry sensor having a reference electric field applied in the horizontal orientation parallel to an electric field being sensed and in the vertical orientation orthogonal to the electric field being sensed, respectively. FIGS. 18A and 18B indicate that a photoluminescence component at the beat frequency between the reference electric field and the electric field being sensed can be measured (1802) when the two field are parallel, and that such photoluminescence component is absent (1804) when the two electric fields are orthogonal, consistent with the description above with respect to FIG. 10.

Figure 19A:
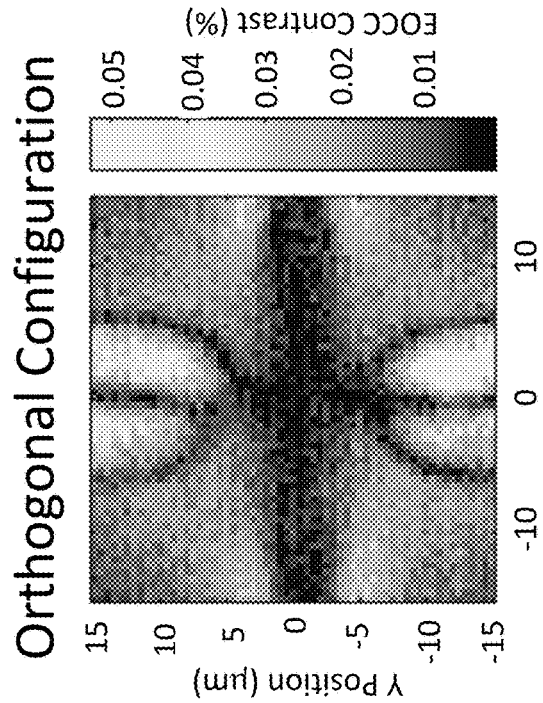
FIGS. 19A-19D show exemplary coherent heterodyne detection results.
Figure 19B:
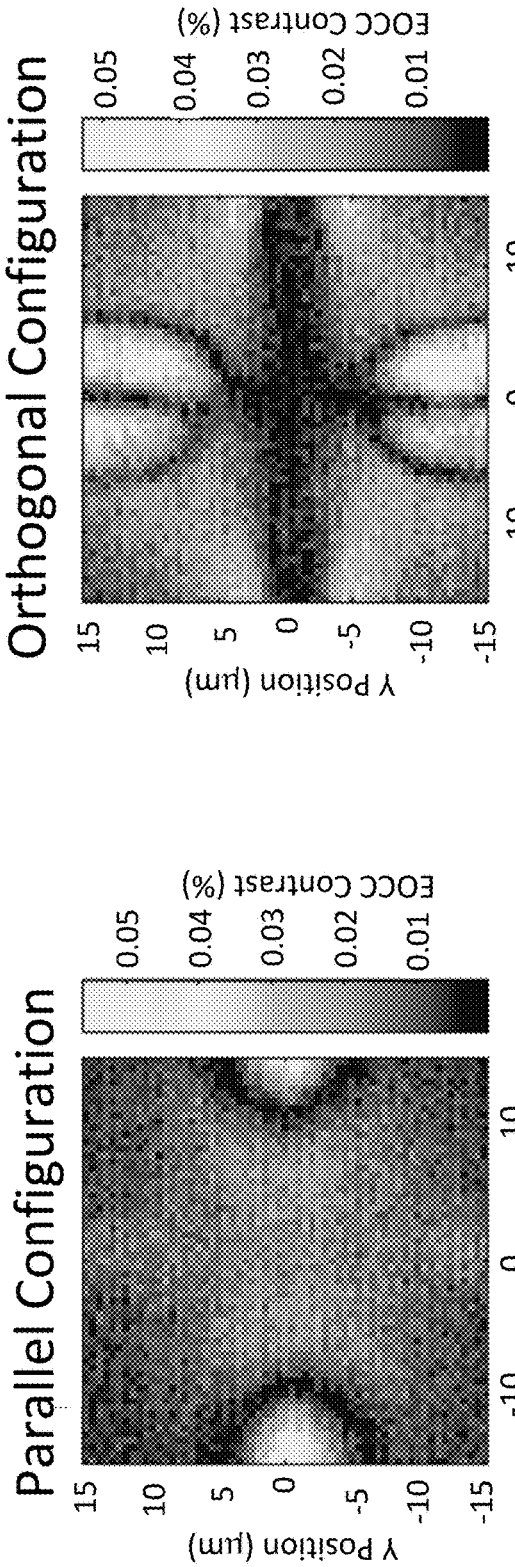
Figure 19C:
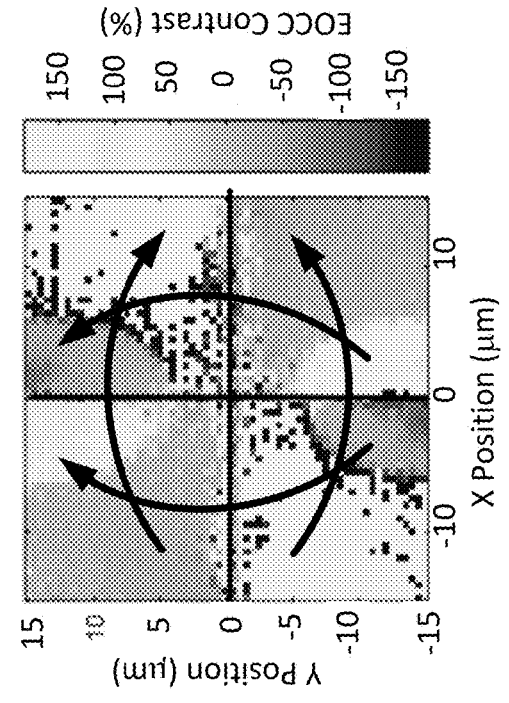
Figure 19D:
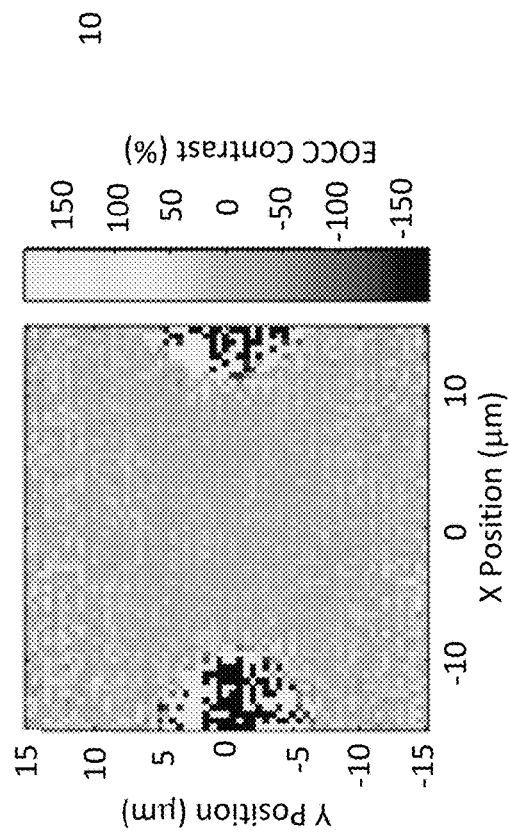

FIGS. 19A-19D shows exemplary coherent heterodyne measurements, in which the sign (direction) of the electric filed in the vector space (not just orientation without sign information) may be determined. FIGS. 19A and 19B are similar to FIGS. 18A and 19B. The coherent measurement however provides both magnitude and phase of the detection. The magnitude is the same in both coherent and incoherent detection, but only coherent measurement can give the phase relationship (between the electric field being sensed and the reference electric field), which may be obtained from the lock-in). Correspondingly, FIGS. 19C and 19D plots the phase measurements from the lock-in amplifier. As shown by FIG. 19C, when two electric fields are aligned (in orientation, i.e., the same sign and direction), the phase is always 0. When the two electric fields are orthogonal to one another (by, for example, applying the two electric fields using electrodes that orthogonal), the electric fields are aligned (of the same sign) in 2 out for 4 space quadrants and opposite sign (phase 180 degrees) in the other 2 of the 4 space quadrants, as shown in FIG. 19D. The electric fields are indicated by the arrows in FIG. 19D.

As such, the electrometry implementations disclosed above and based on electric field dependent charge state conversion in semiconductors may be used to detect various characteristics of an environmental electric field, in a wide spectral range (e.g., radio wave and microwave frequencies). Such electrometry systems may be used to detect the presence of environmental electrical field in a binary manner. In addition, various characteristics of the environmental electric filed may be detected (e.g., magnitude and spectral frequency).

While the particular invention has been described with reference to illustrative embodiments, this description is not meant to be limiting. Various modifications of the illustrative embodiments and additional embodiments of the invention, will be apparent to one of ordinary skill in the art from this description. Those skilled in the art will readily recognize that these and various other modifications can be made to the exemplary embodiments, illustrated and described herein, without departing from the spirit and scope of the present invention. It is therefore contemplated that the appended claims will cover any such modifications and alternate embodiments. Certain proportions within the illustrations may be exaggerated, while other proportions may be minimized. Accordingly, the disclosure and the figures are to be regarded as illustrative rather than restrictive.

The invention claimed is:

1. A system comprising:
    a sensor comprising a crystalline lattice having at least one defect;
    a first optical source emitting a first optical beam at a first optical wavelength;
    a second optical source emitting a second optical beam at a second optical wavelength;
    an optical detector for monitoring a photoluminescence emitted from the sensor when the sensor is excited by the first optical beam and the second optical beam;
    a database;
    a processor configured to:
        extract a first set of parameters from the photoluminescence;
        obtain a second set of predetermined parameters from a reference photoluminescence measured by the sensor and stored in the database; and
        determine a characteristic of an environmental electric field in which the sensor is disposed according to the first set of parameters in comparison to the second set of predetermined parameters.

2. The system of claim 1, wherein the at least one defect is configured to be pre-excited by the first optical beam into a first charge state of the defect.

3. The system of claim 2, wherein the at least one defect is configured to undergo a conversion by the second optical beam from the first charge state to a second charge state of the at least one defect, the conversion being dependent on the environmental electric field and the second charge state being distinct from the first charge state.

4. The system of claim 3, wherein the reference photoluminescence is pre-measured by the sensor without a presence of the environmental electric field.

5. The system of claim 4, wherein the processor is configured to determine the environmental electric field by:
    determining a difference between the first set of parameters and the second predetermined set of parameters; and
    determining one or more characteristics of the environmental electrical field according to the difference.

6. The system of claim 1, wherein the processor is further configured to fit the photoluminescence from the sensor to a stretch exponential decay to obtain a set of fitting parameters, and to determine the characteristic of the environmental electric field according to the set of fitting parameters.

7. The system of claim 1, wherein the crystalline lattice comprises a silicon carbide lattice comprising a 4H-SiC or a 6H-SiC crystalline lattice.

8. The system of claim 7, wherein the at least one defect comprises at least one silicon vacancy or divacancy.

9. The system of claim 1, wherein the first optical wavelength is shorter than the second optical wavelength.

10. The system of claim 9, wherein the first optical wavelength is in a wavelength range of 340 and 430 nanometers and the second optical wavelength is in a wavelength range of 700 and 1100 nanometers.

11. A system for measuring characteristics of an environmental electric field, comprising:
    a sensor comprising a crystalline lattice having at least one defect and a pair of electrodes for applying a reference electric field;
    a first optical source emitting a first optical beam at a first optical wavelength;
    a second optical source emitting a second optical beam at a second optical wavelength;
    an optical detector for generating an electric signal by collecting a photoluminescence from the sensor when the sensor is excited by the first optical beam and the second optical beam in presence of the environmental electric field and the reference electric field; and
    a circuitry configured to:
        filter the electric signal to obtain a signal component at a beat frequency between the environmental electric field and the reference electric field; and
        extract one or more characteristics of the environmental electric field based on the signal component and characteristics of the reference electric field.

12. The system of claim 11, wherein the second optical beam comprises a sequence of pulses having a pulsing frequency and wherein the optical detector is configure to:
    sweep the pulsing frequency while collecting the photoluminescence by the sensor; and
    determine an oscillation frequency as one of the one or more characteristics of the environmental electric field.

13. The system of claim 11, wherein the one or more characteristics of the environmental electric field further comprise an electric field amplitude, and the circuitry is further configured to:
    obtain one or more reference characteristics of a reference photoluminescence emitted by the sensor when disposed in the reference electric field having an oscillation frequency without the environmental electric field; and
    determine the electric field amplitude of the environmental electric field according to the signal component and the one or more reference characteristics of the reference photoluminescence.

14. The system of claim 13, wherein the signal component comprises a spectral distribution of intensity of the photoluminescence and the one or more reference characteristics of the reference photoluminescence comprises a reference spectral distribution of intensity of the reference photoluminescence.

15. The system of claim 11, wherein the crystalline lattice comprises a 4H-SiC or a 6H-SiC silicon carbide crystalline lattice.

16. The system of claim 15, wherein the at least one defect comprises at least one silicon vacancy or divacancy.

17. The system of claim 11, wherein the first optical wavelength is shorter than the second optical wavelength.

18. The system of claim 17, wherein the first optical wavelength is in a wavelength range of 340 and 430 nanometers and the second optical wavelength is in a wavelength range of 700 and 1100.

19. The system of claim 11, wherein the one or more characteristics of the photoluminescence is collected at a third optical wavelength and wherein the second optical wavelength is shorter than the third optical wavelength.

20. The system of claim 11, wherein the first optical beam comprises a pulse and the second optical beam comprises a continuous wave optical beam.

* * * * *